(12) United States Patent
Röhrer

(10) Patent No.: US 12,132,132 B2
(45) Date of Patent: Oct. 29, 2024

(54) SEMICONDUCTOR BODY, AVALANCHE PHOTODIODE AND METHOD FOR FABRICATING A SEMICONDUCTOR BODY

(71) Applicant: ams AG, Premstätten (AT)

(72) Inventor: Georg Röhrer, Premstätten (AT)

(73) Assignee: AMS AG, Premstätten (AT)

( * ) Notice: Subject to any disclaimer, the term of this patent is extended or adjusted under 35 U.S.C. 154(b) by 419 days.

(21) Appl. No.: 17/615,719

(22) PCT Filed: May 29, 2020

(86) PCT No.: PCT/EP2020/065058
§ 371 (c)(1),
(2) Date: Dec. 1, 2021

(87) PCT Pub. No.: WO2020/245061
PCT Pub. Date: Dec. 10, 2020

(65) Prior Publication Data
US 2022/0238744 A1    Jul. 28, 2022

(30) Foreign Application Priority Data

Jun. 3, 2019 (EP) .................................... 19177926
Jul. 26, 2019 (EP) .................................... 19188664

(51) Int. Cl.
*H01L 31/107* (2006.01)
*H01L 31/18* (2006.01)

(52) U.S. Cl.
CPC ........ *H01L 31/107* (2013.01); *H01L 31/1804* (2013.01)

(58) Field of Classification Search
None
See application file for complete search history.

(56) References Cited

U.S. PATENT DOCUMENTS 7,960,222 B1    6/2011  Kwon
9,728,667 B1 *  8/2017  Johnson .............. H01L 27/1446
(Continued)

FOREIGN PATENT DOCUMENTS

CN        101546789 A      9/2009
EP          3206234 A1      8/2017
(Continued)

OTHER PUBLICATIONS

Angelo Gulinatti et al., "Planar technologies for SPAD arrays with improved performances," Quantum Sensing and Nanophotonic Devices IX. vol. 8268. International Society for Optics and Photonics (2012): 1-7.

(Continued)

*Primary Examiner* — Benjamin P Sandvik
(74) *Attorney, Agent, or Firm* — MH2 Technology Law Group LLP

(57) ABSTRACT

A semiconductor body comprises a buried layer of a first type of conductivity, a first region of the first type of conductivity, a shallow region of a second type of conductivity at a first surface of the semiconductor body, a sinker of the first type of conductivity located at the first surface of the semiconductor body, and a separating region of the first type of conductivity encircling at least one of the sinker and the buried layer. The first region is between the buried layer and the shallow region.

15 Claims, 16 Drawing Sheets

(56) References Cited

U.S. PATENT DOCUMENTS

| | | | |
|---|---|---|---|
| 2008/0230817 A1 | 9/2008 | Yasukawa | |
| 2009/0242933 A1 | 10/2009 | Hu et al. | |
| 2010/0271108 A1 | 10/2010 | Sanfilippo et al. | |
| 2011/0215402 A1 | 9/2011 | Lee | |
| 2011/0241149 A1* | 10/2011 | Mazzillo | H01L 31/107 |
| | | | 257/438 |
| 2011/0272561 A1* | 11/2011 | Sanfilippo | H01L 31/022408 |
| | | | 438/73 |
| 2013/0193546 A1* | 8/2013 | Webster | H01L 31/02363 |
| | | | 257/438 |
| 2016/0373676 A1 | 12/2016 | Zhang et al. | |
| 2017/0092801 A1* | 3/2017 | Moussy | H01L 31/107 |
| 2017/0365636 A1* | 12/2017 | Mazzillo | H01L 27/14647 |
| 2018/0097132 A1 | 4/2018 | Chen et al. | |
| 2019/0280145 A1* | 9/2019 | Natsuaki | H01L 31/02363 |
| 2020/0028019 A1* | 1/2020 | Takimoto | H01L 31/107 |
| 2020/0075793 A1 | 3/2020 | Cheng et al. | |
| 2020/0303580 A1* | 9/2020 | Yasuda | H01L 27/14636 |

FOREIGN PATENT DOCUMENTS

| | | |
|---|---|---|
| EP | 3435419 A1 | 1/2019 |
| EP | 3435422 A1 | 1/2019 |
| EP | 3435428 A1 | 1/2019 |
| JP | 2008235510 A | 10/2008 |
| TW | 201701642 A | 1/2017 |
| TW | 201717373 A | 5/2017 |

OTHER PUBLICATIONS

Mattia Assanelli et al., "Photon-Timing Jitter Dependence on Injection Position in Single-Photon Avalanche Diodes," IEEE Journal of Quantum Electronics 47.2 (2011): 151-159.

Myung-Jae Lee et al., "A first single-photon avalanche diode fabricated in standard SOI CMOS technology with a full characterization of the device," Optics express 23.10 (2015): 13200-13209.

Silvaco, Stimulation Standard, "Minimization of Well-Proximity Effect by Means of 2D and 3D Monte Carlo Simulation of Retrograde Well Implantation," Retrieved from the Internet on May 29, 2019: https://www.silvaco.com/tech_lib_TCAD/simulationstandard/2009/jan_feb_mar/a5/a5.html, pp. 1-11.

"Single Photon Avalanche Diode Laboratory SPADLab,": Retrieved from the Internet on May 29, 2019: http://home.deib.polimi.it/cova/elet/Articoli%20e%20presentazioni/2013SPADlab_SSN.pdf, pp. 1-81.

International Search Report and Written Opinion dated Aug. 14, 2020, International Application No. PCT/EP2020/065058, pp. 1-10.

Chinese Examination Report dated Jul. 20, 2023, issued in Chinese Patent Application No. 2020800549686, with English translation, 18 pages.

European Examination Report dated Jul. 27, 2023, issued in European Patent Application No. 19188664.7, 4 pages.

Taiwan Examination Report dated Dec. 26, 2023, issued in Taiwan Patent Application No. 109118460, with English translation, 18 pages.

* cited by examiner

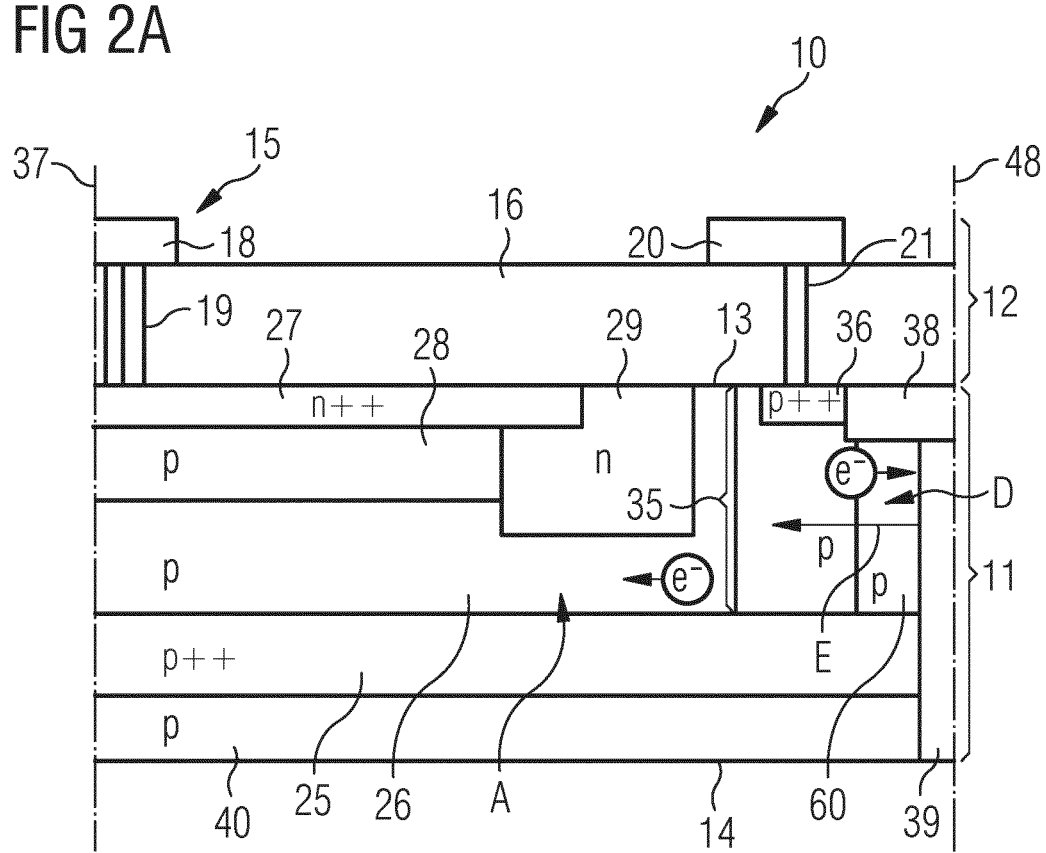

BTotal (cm$^{-3}$)
1.149e+17
2.549e+16
1.097e+16
3.389e+15
1.047e+15
2.236e+14
1.000e+14

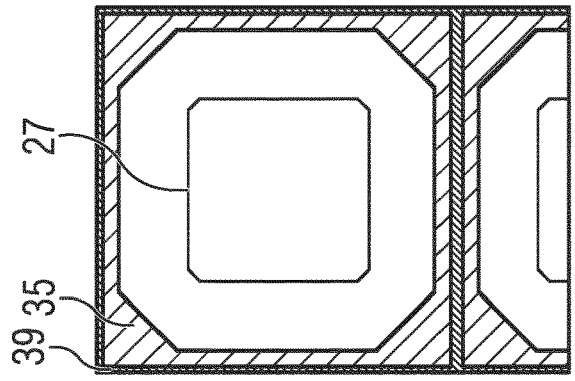
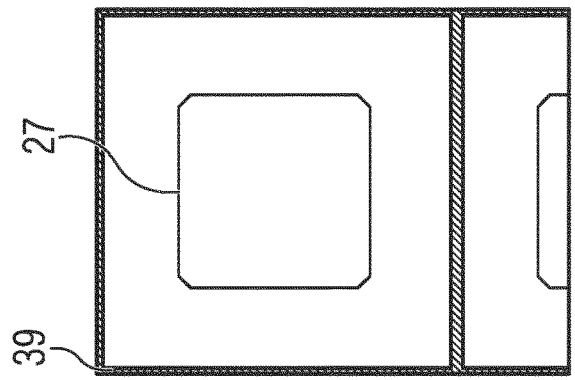
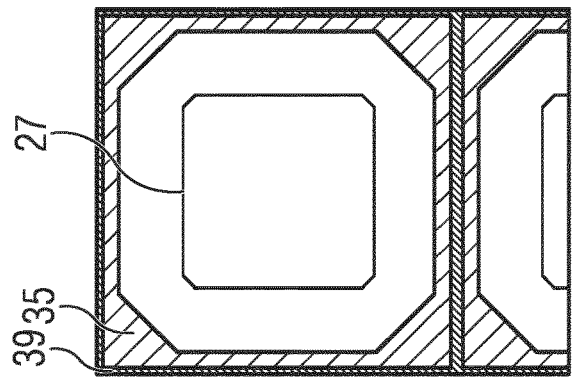
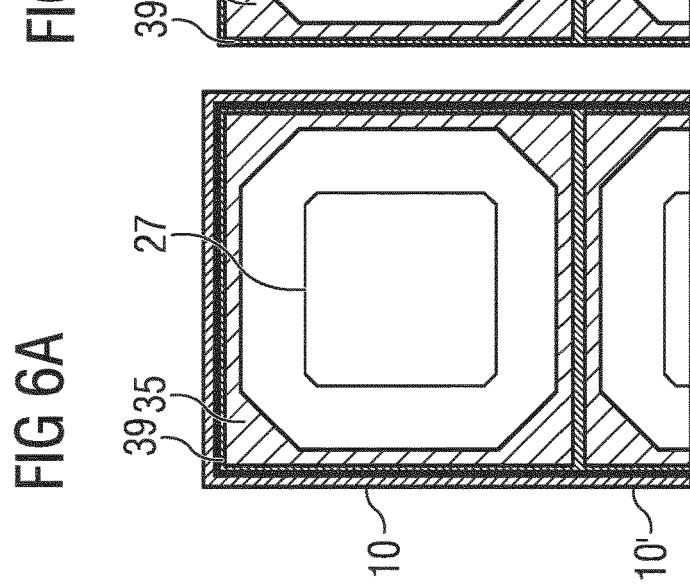

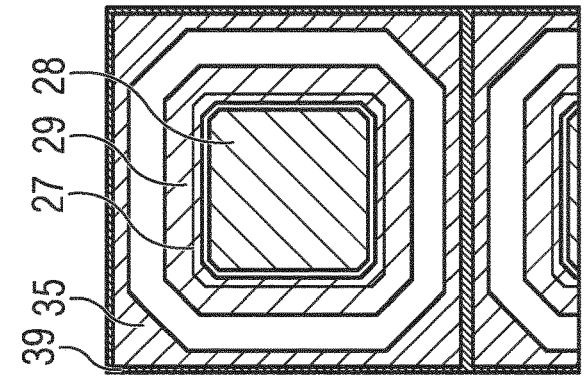
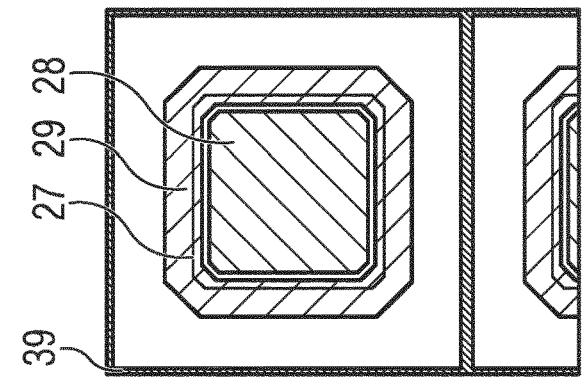
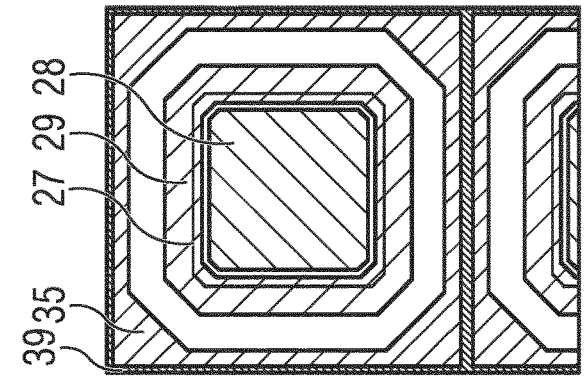
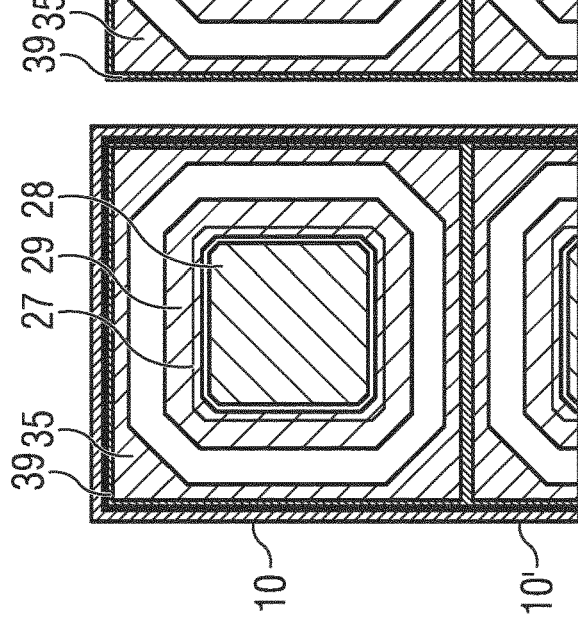

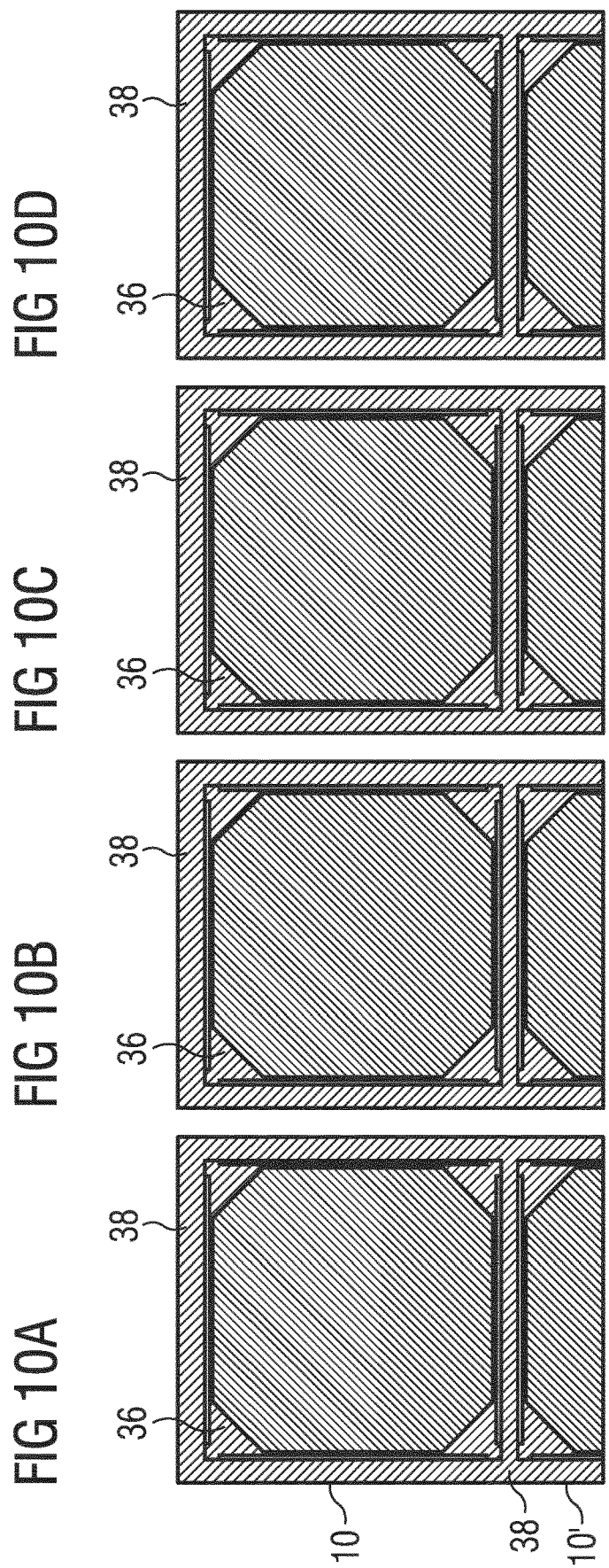

SEMICONDUCTOR BODY, AVALANCHE PHOTODIODE AND METHOD FOR FABRICATING A SEMICONDUCTOR BODY

CROSS-REFERENCE TO RELATED APPLICATIONS

The present application is the national stage entry of International Patent Application No. PCT/EP2020/065058, filed on May 29, 2020, and published as WO 2020/245061 A1 on Dec. 10, 2020, which claims the benefit of priority of European Patent Application Nos. 19177926.3 filed on Jun. 3, 2019, and 19188664.7 filed on Jul. 26, 2019, all of which are incorporated by reference herein in their entirety.

FIELD OF THE INVENTION

The present disclosure is related to a semiconductor body, an avalanche photodiode and a method for fabricating a semiconductor body.

BACKGROUND OF THE INVENTION

An avalanche photodiode may be implemented as a single-photon avalanche diode, which may be abbreviated SPAD and also named "Geiger-mode avalanche photodiode". The avalanche photodiode comprises a semiconductor body and a stack having one or more than one isolating layers and one or more than one metallization layers for electrically contacting different regions of the semiconductor body.

The semiconductor body comprises a first region of a first type of conductivity and a shallow region of a second type of conductivity that is arranged at the first region. A voltage is provided to the shallow region and the first region such that a space-charge region is generated between the first region and the shallow region. There is an avalanche multiplication region at the border of the first region to the shallow region. The absorption of a photon in the avalanche multiplication region results in the generation of an electron that is multiplied according to the avalanche multiplication effect. Electrons from a depletion region drift towards the avalanche multiplication region. However, also electrons generated outside of the depletion region can diffuse towards the depletion region. Since this diffusion is a slow process, a timing jitter between a light pulse and the avalanche multiplication is increased.

SUMMARY OF THE INVENTION

It is an object to provide a semiconductor body, an avalanche photodiode and a method for fabricating a semiconductor body that provide structures with reduced timing jitter.

These objects are achieved by the subject-matter of the independent claims. Further developments and embodiments are described in the dependent claims.

In an embodiment, the semiconductor body comprises a buried layer of a first type of conductivity, a first region of the first type of conductivity, a shallow region of a second type of conductivity at a first surface of the semiconductor body, a sinker of the first type of conductivity located at the first surface of the semiconductor body and a separating region of the first type of conductivity. The separating region encircles at least one of the sinker and the buried layer. The first region is between the buried layer and the shallow region.

Advantageously, the separating region hinders electrons to reach an avalanche multiplication region. The avalanche multiplication region is located at the border of the shallow region. Thus, a timing jitter is reduced by the separating region.

The first type of conductivity is opposite to the second type of conductivity. The first type of conductivity may be p-type (the regions and layers of the first type of conductivity are p-doped). The second type of conductivity may be n-type (the regions and layers of the second type of conductivity are n-doped).

Alternatively, the first type of conductivity may be n-type (the regions and layers of the first type of conductivity are n-doped). The second type of conductivity may be p-type (the regions and layers of the second type of conductivity are p-doped).

The word "encircles" means surrounds or encompasses in a plane of the semiconductor body such as e.g. at the first surface or another plane of the semiconductor body that is parallel to the first surface. The separating region encircles at least one of the sinker and the buried layer in planes of the semiconductor body that are different from the first surface, especially below the first surface.

In an embodiment, a doping concentration of the separating region is lower than a doping concentration of the sinker and/or the buried layer. There is a gradient of the doping concentration between the separating region and the sinker and also between the separating region and the buried layer. Advantageously, this gradient results in an electric field that hinders electrons to reach an avalanche multiplication region.

In an embodiment, the semiconductor body comprises an enhancement region of the first type of conductivity located between the first region and the shallow region. A doping concentration of the enhancement region may be higher than a doping concentration of the first region. The doping concentration of the enhancement region is lower than a doping concentration of the buried layer. The enhancement region may be named enhancement layer. The enhancement layer adjusts the break down voltage. Generally a lower break down voltage reduces the power consumption.

In an embodiment, the semiconductor body comprises an isolation region located at the first surface of the semiconductor body. The isolation region encircles the sinker at the first surface. The isolation region may be realized as a shallow trench isolation. Advantageously, the isolation region separates one avalanche photodiode from an adjacent avalanche photodiode.

In an embodiment, the sinker encircles the first region. Advantageously, the first region and the enhancement region are enclosed by the sinker, the buried layer and the shallow region at each border or nearly each border. Thus, the first region and the enhancement region are enclosed by crystal material. Advantageously, disturbances and a not desired generation of charge carries is avoided at the border of the buried layer and the shallow region. A doping concentration of the sinker is higher than the minimum doping concentration of the first region.

In an embodiment, the sinker extends from the first surface of the semiconductor body to the buried layer. Advantageously, the buried layer is electrically connected via the sinker by a low-resistance connection.

In an embodiment, the sinker has a first doping concentration at the first surface of the semiconductor body. This region may be realized by a sinker contact region of the sinker. The sinker has a second doping concentration in a region between the first surface of the semiconductor body and the buried layer. The second doping concentration is lower than the first doping concentration and lower than a maximum doping concentration of the buried layer. The second doping concentration may be higher than the minimum doping concentration of the first region.

In an embodiment, the sinker is fabricated at least partially using a well proximity effect, shortened WPE, during fabrication of the buried layer. The sinker described in the paragraph above can be fabricated using the WPE. Advantageously, the number of ion implantation steps can be kept low. The sinker fabricated by WPE is different from a sinker fabricated using a mask, an ion implantation step and an annealing step. The difference can be detected by determining doping concentrations of a cross section through the sinker.

In an embodiment, the separating region encircles the sinker.

In an embodiment, the semiconductor body comprises a deep trench. The deep trench includes at least one isolating layer. Advantageously, the deep trench provides a good isolation between adjacent avalanche photodiodes.

In an embodiment, the deep trench encircles the separating region. Advantageously, the separating region is located between the sinker and the deep trench. Thus, electrons generated at the interface between the isolating layer of the deep trench and the crystal can be hindered from drifting towards the avalanche multiplication region.

In an embodiment, the separating region encircles the buried layer. The buried layer may be named buried region.

In an embodiment, the separating region is located between the sinker and the buried layer.

The sinker may be fabricated using WPE.

In an embodiment, the semiconductor body comprises a guard ring of the second type of conductivity located at the first surface of the semiconductor body and encircling the shallow region. A doping concentration of the guard ring is lower than a doping concentration of the shallow region.

In an embodiment, the semiconductor body comprises a shield ring of the first type of conductivity. The shield ring is arranged between the guard ring and the buried layer. A doping concentration of the shield ring is lower than the doping concentration of the buried layer and may be higher than a minimum doping concentration of the first region. The shield ring may be fabricated by the WPE.

In an embodiment, the semiconductor body comprise a substrate. The substrate may be at a second surface of the semiconductor body. The buried layer is arranged between the substrate and the first region. The substrate may have the first type of conductivity. A doping concentration of the substrate is lower than the doping concentration of the buried layer.

The doping concentration of the first region may be equal or approximately equal to the doping concentration of the substrate at least at some areas of the first region.

The doping concentration of the separating region may be equal or approximately equal to the doping concentration of the substrate at least at some areas of the separating region.

In an embodiment, an avalanche photodiode comprises the semiconductor body and a stack of at least one isolating layer and at least one metallization layer. The stack is located at the first surface of the semiconductor body. The avalanche photodiode may be implemented as single-photon avalanche photodiode, abbreviated SPAD. The avalanche photodiode may be back side illuminated (in this case, the light goes through the buried layer to the first region) or front side illuminated (in this case, the light goes through the stack to the shallow region).

A device may comprises an array of avalanche photodiodes. The device comprises the semiconductor body and the stack. The device may include an array of pixels. Each pixel comprises one avalanche photodiode.

A time-of-flight arrangement may comprise the avalanche photodiode. A low jitter is advantageous in this application. An avalanche photodiode such as a SPAD or an array of avalanche photodiodes such as SPADs may be applied e.g. for time of flight measurement, a four quadrant SPAD detector for adaptive optics, quantum key distribution, single molecule spectroscopy, single molecule conformational dynamics, DNA analysis by capillary electrophoresis, DNA fragment separation in a microchip, a matrix detector for analysis of protein microarray, fluorescence correlation spectroscopy, fluorescence lifetime spectroscopy and/or fluorescence lifetime imaging.

In an embodiment, a method for fabricating a semiconductor body comprises fabricating a buried layer of a first type of conductivity, fabricating a shallow region of a second type of conductivity at a first surface of the semiconductor body, and fabricating a sinker of the first type of conductivity located at the first surface of the semiconductor body.

A separating region of the first type of conductivity encircles at least one of the sinker and the buried layer. A first region has a first type of conductivity and is between the buried layer and the shallow region. Advantageously, the separating region reduces the timing jitter.

The above list of steps may not specify the chronological order.

In an embodiment, the sinker is fabricated at least partially using a well proximity effect during fabrication of the buried layer. Thus, the lower part of the sinker and the buried layer are fabricated at the same time, e.g. using one mask and one ion implantation step or using one mask and two ion implantation steps or using one mask and more than one ion implantation step. Optionally, the lower part of the sinker and the buried layer are fabricated by two high energy implantation steps with e.g. 2000 keV and 1500 keV implantation energy.

With this disclosure, the following issues for a back side illuminated single-photon avalanche photodiode, shortened BSI SPAD, with deep trench isolation may be reduced/improved:

Reduced jitter tail.

No increase of the dark count rate (shortened DCR) due to deep trench isolation.

Reduced process complexity.

In the avalanche photodiode, an electric field is introduced which prevents electrons from the deep trench to reach the avalanche multiplication region. The structure which achieves this effect is a split guard ring. An electric field is introduced which prevents electrons from reaching the avalanche multiplication region, when electrons are generated outside of the active area. The method for fabrication saves one mask and corresponding implants by using the well proximity effect.

The method for fabricating a semiconductor body and an avalanche diode may be implemented e.g. by the semiconductor body and the avalanche diode according to one of the embodiments defined above.

BRIEF DESCRIPTION OF THE DRAWINGS

The following description of figures of embodiments may further illustrate and explain aspects of the semiconductor body, the avalanche diode and the method for fabricating the semiconductor body and the avalanche diode. Regions, areas and layers with the same structure and the same effect, respectively, appear with equivalent reference symbols. In so far as regions, areas and layers correspond to one another in terms of their function in different figures, the description thereof is not repeated for each of the following figures.

FIGS. 2A to 2D show further examples of cross-sections of an avalanche photodiode;

FIGS. 6A to 6D, 7A to 7D, 8A to 8D, 9A to 9D, 10A to 10D and 11A to 11D show examples of layouts of masks for fabricating avalanche photodiodes.

DETAILED DESCRIPTION

Figure 1A:
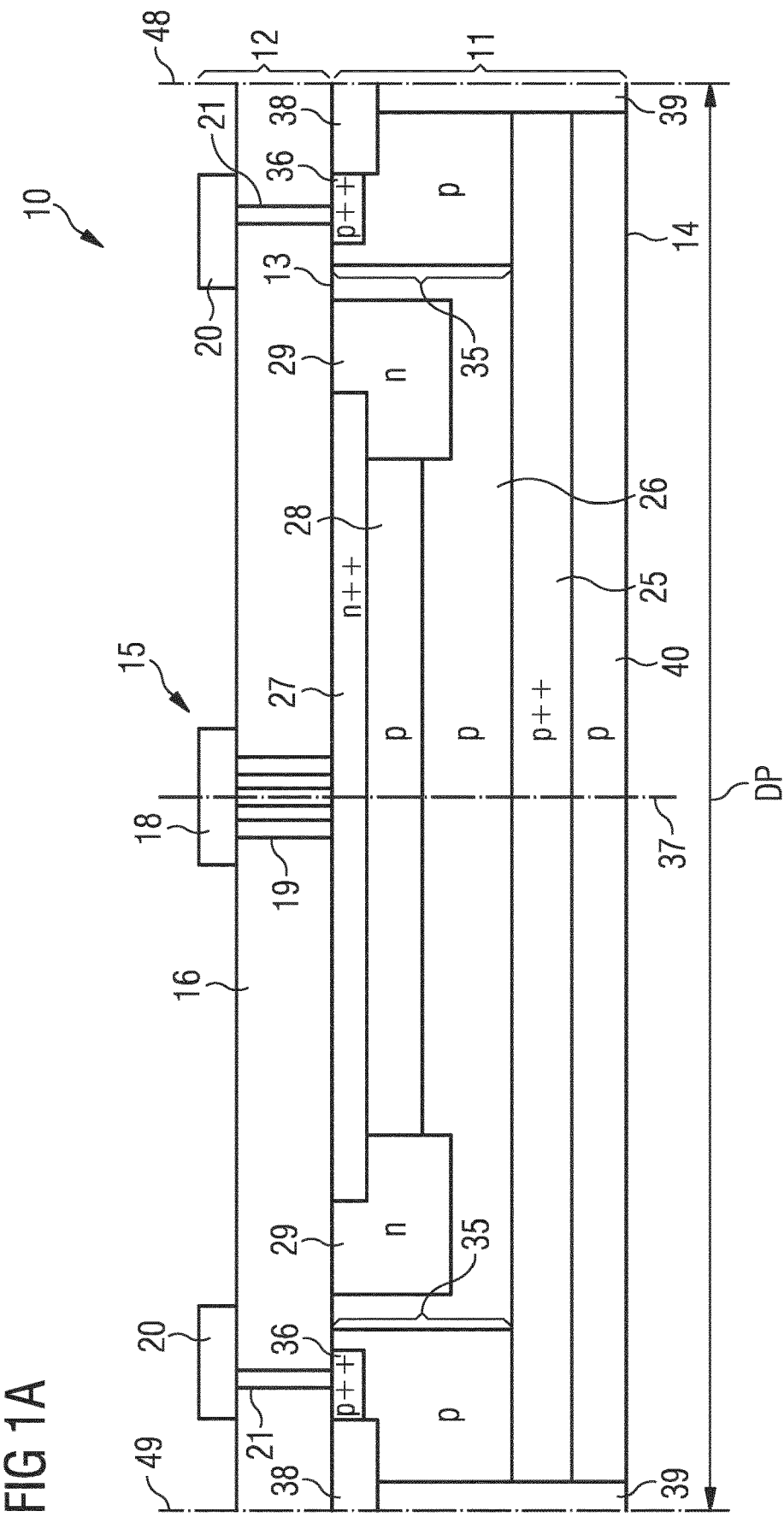
FIGS. 1A to 1C show an example of a cross-section of an avalanche photodiode.

FIG. 1A shows an example of a cross-section of an avalanche photodiode 10. The avalanche photodiode 10 comprises a semiconductor body 11 and a stack 12. The semiconductor body 11 comprises a first and a second surface 13, 14. The stack 12 is arranged at the first surface 13 of the semiconductor body 11. The stack 12 comprises a metallization layer 15, an isolating layer 16 and contacts 19, 21. Different parts 18, 20 of the metallization layer 15 are connected via several contacts 19, 21 to regions of the semiconductor body 11. The stack 12 may comprise at least a further isolating layer and at least a further metallization layer, not shown. The metallization layer 15 may be named first metallization layer, shortened M1.

The semiconductor body 11 comprises a buried layer 25 of a first type of conductivity, a first region 26 of the first type of conductivity and a shallow region 27 of a second type of conductivity. The first type of conductivity is opposite to the second type of conductivity. The first type of conductivity may be p-type conductivity so that the second type of conductivity is n-type conductivity, as indicated in the figures as an example. Alternatively, the types of conductivity may be reversed such that the first type of conductivity is n-type conductivity and the second type of conductivity is p-type conductivity. The buried layer 25 is realized as a deep implanted buried layer.

The stack 12 is on top of the first surface 13 of the semiconductor body 11. Thus, the stack 12 is on top of the shallow region 27. The shallow region 27 is arranged at the first surface 13 of the semiconductor body 11. Thus, the shallow region 27 is on top of the first region 26. The first region 26 is on top of the buried layer 25. A part 18 of the metallization layer 15 is coupled by at least one contact 19 to the shallow region 27.

The semiconductor body 11 comprises an enhancement region 28 having the first type of conductivity. The enhancement region 28 is arranged between the first region 26 and the shallow region 27. In a top view shown in FIG. 6A, the shallow region 27 has the shape of a closed area such as, for example, an octagon, a quadrat, a rectangle or a circle. Correspondingly, the enhancement region 28 also has the shape of a closed area. The enhancement region 28 is fabricated by an implantation suitable to form the first type of conductivity. The enhancement region 28 may be e.g. fabricated by a p-enhancement implant or a p enhancement implant.

The semiconductor body 11 comprises a guard ring 29 of the second type of conductivity. The guard ring 29 may be realized as a well, e.g. an n-well. The guard ring 29 is arranged at the first surface 13 of the semiconductor body 11. The guard ring 29 encircles the shallow region 27. Thus, in the top view on the first surface 13 of the semiconductor body 11, the guard ring 29 encircles the shallow region 27. In the top view on the first surface 13 of the semiconductor body 11, the guard ring 29 is located at each border of the area of the shallow region 27 and thus surrounds or encloses the shallow region 27.

The semiconductor body 11 comprises a sinker 35. The sinker 35 is at the first surface 13 of the semiconductor body 11. The sinker 35 may be realized as a well, e.g. as a p well. The sinker 35 may have a sinker contact region 36 at the first surface 13 of the semiconductor body 11. The sinker 35 is of the first type of conductivity. The sinker contact region 36 is a highly doped region of the first type of conductivity. The sinker 35 may extend up to the buried layer 25. A second part 20 of the metallization layer 15 may be coupled by a contact 21 to the sinker 35 and more especially to the sinker contact region 36. Thus, the second part 20 of the metallization layer 15 is electrically connected by the contact 21 and the sinker 35 to the buried layer 25.

The first region 26 has a part between the guard ring 29 and the buried layer 25. The first region 26 has a further part between the guard ring 29 and the sinker 35.

The avalanche photodiode 10 may have a cross-section that is symmetrical to a middle axis 37. Thus, the guard ring 29 seen at the right half of the cross-section is also present at the left half of the cross-section. Correspondingly, the sinker 35 and the second part 20 of the metallization layer 15 are not only shown in the right half of the cross-section, but also in the left half of the cross-section. Thus, the same reference numerals are used in the left halve and in the right halve of the cross-section. Therefore, in the further FIGS. 1B to 4D, only the "right" half of the avalanche photodiode 10 is shown.

Additionally, the semiconductor body 11 comprises an isolation region 38. The isolation region 38 is located at the first surface 13 of the semiconductor body 11. The isolation region 38 may be implemented as a shallow trench isolation. The isolation region 38 encircles the sinker 35. More specifically, the isolation region 38 encircles the sinker contact region 36. Thus, the isolation region 38 surrounds or encompasses the sinker 35 in a top view on the first surface 13 of the semiconductor body 11.

Furthermore, the semiconductor body 11 comprises a deep trench 39. The deep trench 39 encircles the sinker 35. The deep trench 39 may extend from the first surface 13 of the semiconductor body or from the isolation region 38. On the other side the deep trench 39 extends at least to the buried layer 25.

In one example, the deep trench 39 is manufactured from the back side. Thus, the deep trench 39 is fabricated from the second surface 14. In case of the deep trench 39 fully isolating each SPAD 10, the deep trench 39 stops in the isolation region 38, also named STI.

Alternatively, the deep trench 39 may end before reaching the isolation region 38. Optionally, the isolation region 38 may be omitted.

In another example, the deep trench 39 is manufactured from the front side. Thus, the deep trench 39 is fabricated from the first surface 13.

The semiconductor body 11 may comprise a substrate 40. The substrate 40 is at the second surface 14 of the semiconductor body 11. The buried layer 25 is located between the substrate 40 and the first region 26. The buried layer 25 is arranged on top of the substrate 40. The deep trench 39 may extend up to the substrate 40 and/or up to the second surface 14. The substrate 40 may be a silicon substrate. The semiconductor body 11 may be made out of silicon.

In FIG. 1A, one pixel realizing one avalanche photodiode 10 is illustrated. A device may comprise an array of avalanche photodiodes 10, wherein each of the avalanche photodiodes 10 is realized as the example elucidated in FIG. 1A. In other words, the device may comprise an array of pixels, wherein each pixel comprises one avalanche photodiode 10. The avalanche photodiode 10 as shown in FIG. 1A has an extension DP in the cross-section. The extension DP may be called "device pitch". In FIG. 1A, the cross-section of the avalanche photodiode 10 is shown between a first border 48 which may be called "right border" and a second border 49 which may be called "left border".

The border between two avalanche photodiodes 10 of the device is arranged in the isolation region 38 and in the deep trench 39. The deep trench 39 is typically shared between two neighboring avalanche photodiodes 10, 10' (as shown e.g. in FIGS. 6A to 6D). Thus, there is a further sinker at the right side of the deep trench 39 and the isolation region 38 shown in the right half of the cross-section and there is also an additional sinker on the left side of the deep trench 39 and the isolation region 38 in the left half of the cross-section comprised by neighboring avalanche diodes.

Figure 1B:
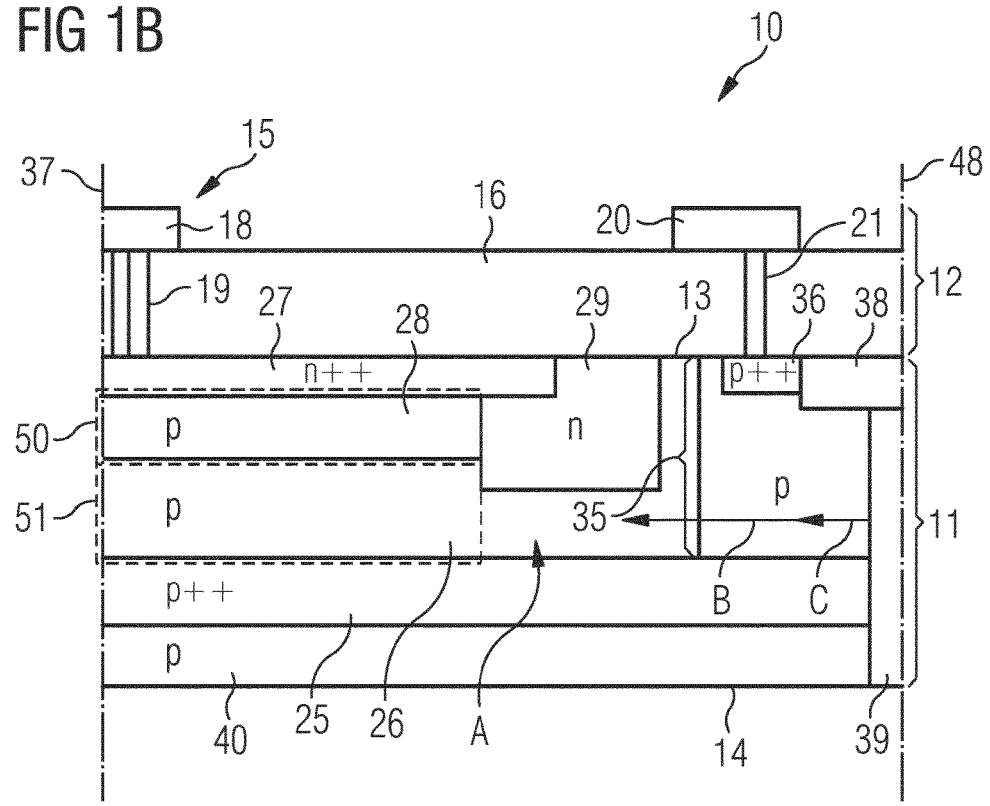

FIG. 1B shows the example of the avalanche photodiode 10 as shown in FIG. 1A with some further explanations. An avalanche multiplication region 50 is formed by parts of the shallow region 27 and parts of the enhancement region 28. As a photon generates an electron in the avalanche multiplication region 50, the avalanche multiplication effect is triggered resulting in a high current between the shallow region 27 and the buried layer 25. A depletion region 51 is located near the avalanche multiplication region 50. The depletion region 51 is formed by parts of the enhancement region 28 and of the first region 26. Electrons in the depletion region 51 are transported toward the avalanche multiplication region 50. During operation, the avalanche multiplication region 50 and the depletion region 51 are inside a space charge region or space charge zone between the shallow region 27 and the guard ring 29 on one side and the enhancement region 28 and the first region 26 on the other side.

In further regions of the first region 26, as indicated by an arrow A, electrons may be generated. Electrons generated outside of the depletion region 51 can diffuse towards the depletion region 51. Since this is a slow process, the timing jitter is increased, resulting e.g. in a long tail in the jitter (shown in FIG. 1C). Since the fill factor of a SPAD (fill factor=(SPAD active area)/(total area)) is typically 30-60%, a significant part of carriers is generated outside of the depletion region 51.

As indicated by an arrow B, an electric field is generated by the doping gradient between the sinker 35 and the first region 26. The doping gradient decreases along the arrow B. Therefore, a positive electric field is introduced which assists electrons to reach the avalanche multiplication region 50. Along an arrow C, the doping is approximately constant. But for an area optimized device this constant doping region will be very small or non-existent. Thus, electrons generated at the interface of the deep trench 39 to silicon will increase the dark count rate of the SPAD 10.

The sinker 35, which may be implemented as a p-well, is typically formed with multiple implants with different energies in order to create a good connection with the deep implanted buried layer 25. The sinker 35 may be fabricated using one mask or two masks.

Alternatively, the guard ring 29 may be omitted.

Alternatively, the enhancement region 28 may be omitted.

In FIG. 1B and also in FIGS. 2A to 2D, the cross-section of one avalanche photodiode 10 is shown between the symmetry axis 37 and the first border 48 of the avalanche photodiode 10.

Figure 1C:
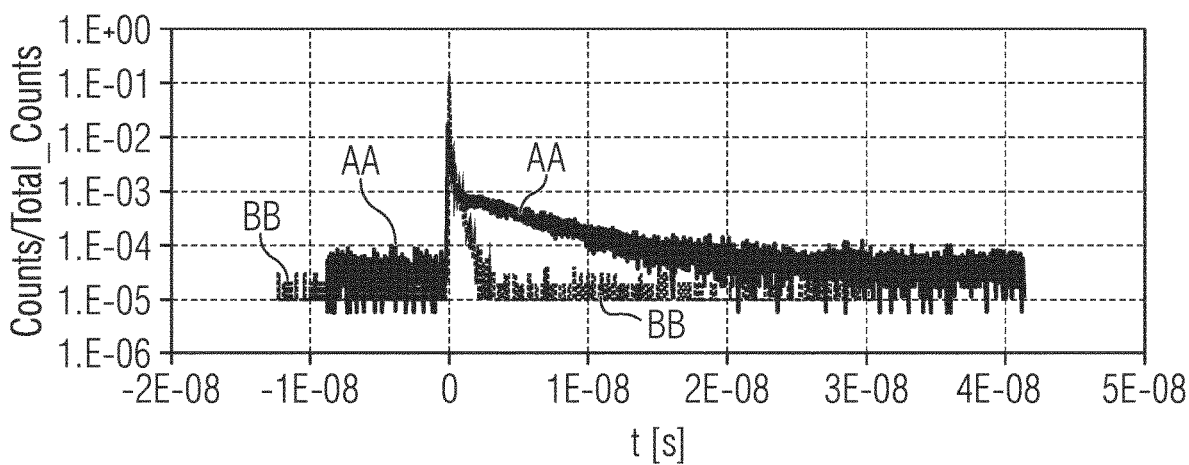

FIG. 1C shows an example of two histograms which may be measured with similar or with other avalanche photodiodes as shown in this disclosure. The counts in every histogram bin are shown as a function of a time t. This time t corresponds to the time from a photon hitting the SPAD until the electrical response of the SPAD is measured and includes a constant offset due to the measurement setup. For easier comparison between different measurements, the constant offset is eliminated by shifting the histogram in such a way that the peak position is shifted to the point of time t=0. Thus, a light pulse is applied a little bit earlier that means at a point of time t<0. The number of counts divided by the number of total counts is shown on one axis. The light source is in such a way (i.e. very weak, e.g. by attenuation) that the avalanche photodiodes obtain only a 1% trigger probability.

The results achieved with a first avalanche photodiode are marked with AA and the results achieved with a second avalanche photodiode are marked with BB. After the point of time t=0, the counts decrease up to a level which corresponds to the dark count rate, abbreviated as DCR. The width of the shown distribution of the counts is called a jitter. The jitter is typically specified as Full-width-at-half-maximum (abbreviated FWHM) or the full width at 10% of the maximum. The jitter is lower for the measurements marked with BB in comparison to the measurements marked with AA. The measurements marked with AA also result in a higher DCR in comparison to the measurements marked with BB.

In the measurements marked with AA, slow carriers (transport to the depletion region 51 by diffusion or weak electric fields only) cause a tail in the jitter characteristics. In the measurements marked with BB, slow carriers cannot reach the avalanche multiplication region 50.

A large jitter tail reduces the signal-to-noise ratio for time-of-flight applications. A time-of-flight arrangement may comprise the avalanche photodiode 10 or an array of avalanche photodiodes 10. If the avalanche photodiode 10 or an array of avalanche photodiodes 10 are used for time-of-flight measurements, a low jitter is advantageous.

FIG. 2A shows an example of a cross-section of an avalanche photodiode 10. This implementation is based on the avalanche photodiode shown in FIGS. 1A and 1B. The semiconductor body 11 comprises a separating region 60. The separating region 60 encircles the sinker 35. Thus, the separating region 60 encompasses or surrounds the sinker 35. At the first surface 13 of the semiconductor body 11, the isolation region 38 encircles the sinker 35. Thus, more precisely, the separating region 60 and the isolation region 38 together encircle the sinker 35. The separating region 60 encircles the sinker 35 in depths between the isolation region 38 and the buried layer 25. The separating region 60 is located between the deep trench 39 and the sinker 35. Thus, the deep trench 39 is separated from the sinker 35 by the separating region 60. The buried layer 25 extends from the deep trench 39 at the first border 48 of the avalanche diode 10 to the second border 49 of the avalanche diode 10.

The separating region 60 is of the first type of conductivity. A minimum doping concentration of the separating region 60 is lower than a maximum doping concentration of the sinker 35. Thus, there is a doping gradient along an arrow E. At an area marked D, there is a positive field resulting in a movement of electrons towards the deep trench 39. The doping gradient increases along the arrow E. Therefore, a positive electric field is introduced which hinders electrons to reach the avalanche multiplication region 50. Thus, electrons generated at the interface of the deep trench 39 to silicon will not increase the DCR of the SPAD 10.

The deep trench 39 is realized by an isolating material. Thus, there is an interface between the semiconductor crystal realizing the sinker 35 and other parts and the isolating layer of the deep trench 39. This interface may cause the generation of electrons. By the electric field the electrons are driven to the deep trench 39 and do not reach the avalanche multiplication region 50.

The transition of the sinker 35 to the first region 26 causes a drift of electrons from this region towards the depletion region 51.

The avalanche photodiode 10 comprises a spacing between the sinker 35 (named p-well) and the deep trench 39 realized by the separating region 60. The avalanche photodiode 10 includes a split guard ring. In the example of FIGS. 1A and 1B, the sinker 35 is shared between two neighboring cells or pixels (i.e. one implant mask opening). In the split guard ring, there are two separate openings in the mask. The split guard ring is formed e.g. by the sinker 35 of one pixel, the separating region 60 of this pixel, a separating region of the neighboring pixel and the sinker of the neighboring pixel. The two separating regions are one structure on the mask. Advantageously, the portion of the DCR that originates from the deep trench 39 is reduced.

Figure 2B:
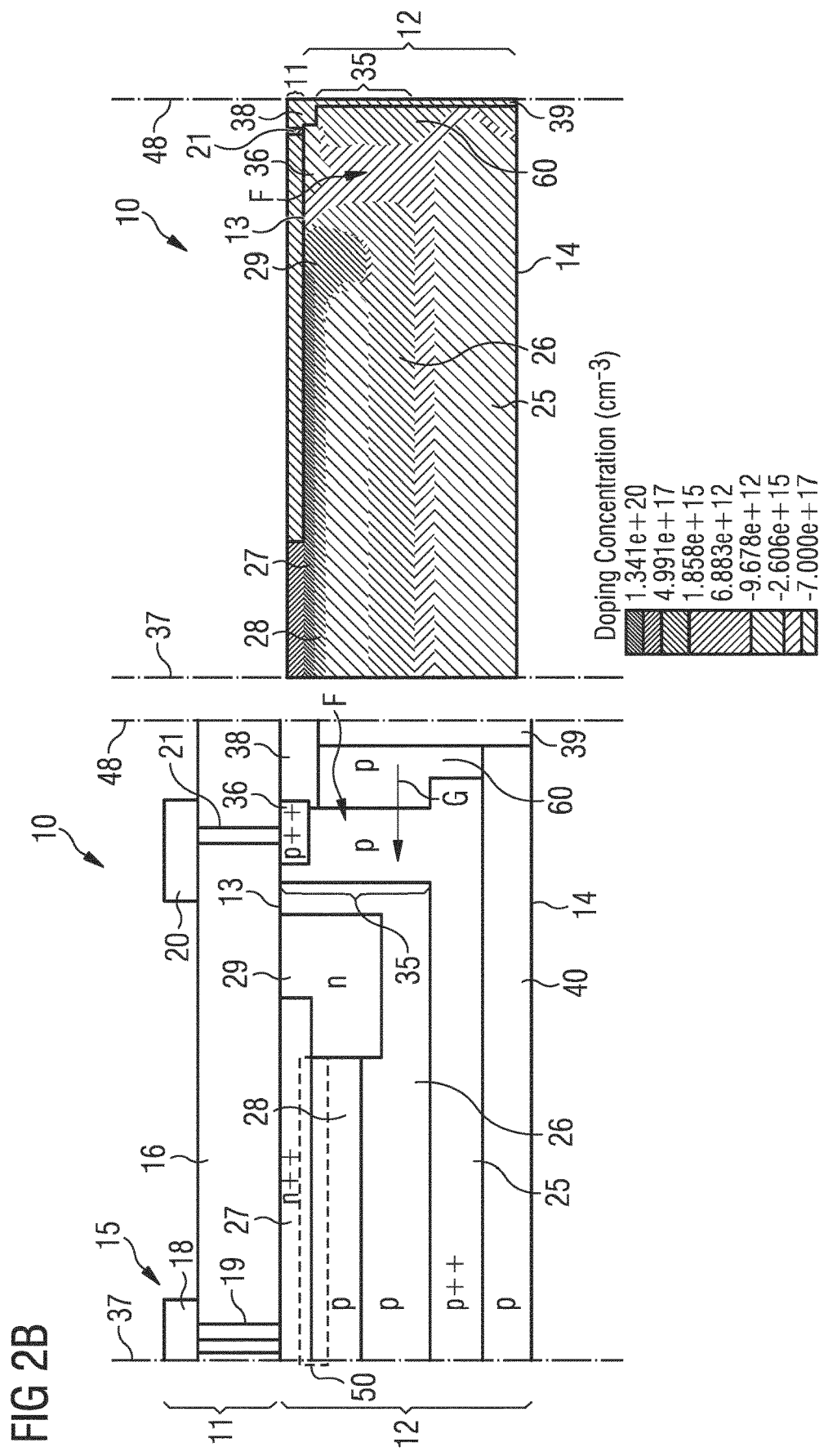

FIG. 2B shows a further example of the avalanche diode 10 which is based on the examples shown in FIGS. 1A, 1B and 2A. The separation region 60 encircles the buried layer 25. Thus, the separating region 60 encompasses or surrounds the buried layer 25 in a plane that is formed by the buried layer 25 and is parallel to the first surface 13. The buried layer 25 is separated by the separating region 60 from the deep trench 39. As shown in the cross-section of FIG. 2B, the buried layer 25 does not reach the deep trench 39.

The sinker 35 is realized using the well proximity effect, abbreviated WPE. The buried layer 25 is fabricated using a mask that is realized such that a photoresist covers an area near the first and the second border 48, 49. For example, the photoresist may cover the area of the isolation region 38. This mask has the effect that a buried layer 25 is realized wherein the buried layer 25 has a gap (which is formed by the separating region 60) to the deep trench 39. The separation region 60 between the sinker 35 and the deep trench 39 as well as between the buried layer 25 and the deep trench 39 is a result of this photoresist. The photoresist has the effect that ions are scattered from the photoresist into the semiconductor body 11 such that the doping concentration of the first type of conductivity is increased in the area between the first surface 13 and the buried layer 25 such that the sinker 35 is fabricated. The sinker 35 is fabricated by doping atoms during implantation of the buried layer 25 using the WPE effect.

In the right side of FIG. 2B, a simulation of the doping concentration is shown. At the first surface 13 of the semiconductor body 11, the sinker contact region 36 is fabricated using a separate fabrication step with a mask and an ion implantation step for realizing the sinker contact region 36. The doping between the sinker contact region 36 and the buried layer 25 is realized using WPE. As shown in the simulation, the doping of the sinker 35 is of the first type of conductivity and has a lower concentration in comparison to the maximum doping concentration of the sinker contact region 36 and also in comparison to the maximum doping concentration of the buried layer 25. The buried layer 25 may be called "deep implanted buried layer".

In an area indicated by an arrow F in the left and in the right figure, a doping is caused by the well proximity effect, abbreviated WPE, due to the implantation of the deep implant buried layer 25. Thus, the sinker 35 is realized (however, with a lower doping concentration than the sinker 35 in FIGS. 1A, 1B and 2A).

A doping gradient increases along an arrow G. Therefore, a positive electric field is introduced which hinders electrons to reach the avalanche multiplication region 50. Thus electrons generated at the interface of the deep trench 39 to the silicon will not increase the DCR of the SPAD 10.

As shown in FIG. 2B, the "p-well" is eliminated, more precisely no mask for fabrication the p-well is required. Advantageously, process complexity is reduced (one mask process step and several implantation process steps can be skipped). The portion of the DCR originating from the deep trench 39 is reduced.

Figure 2C:
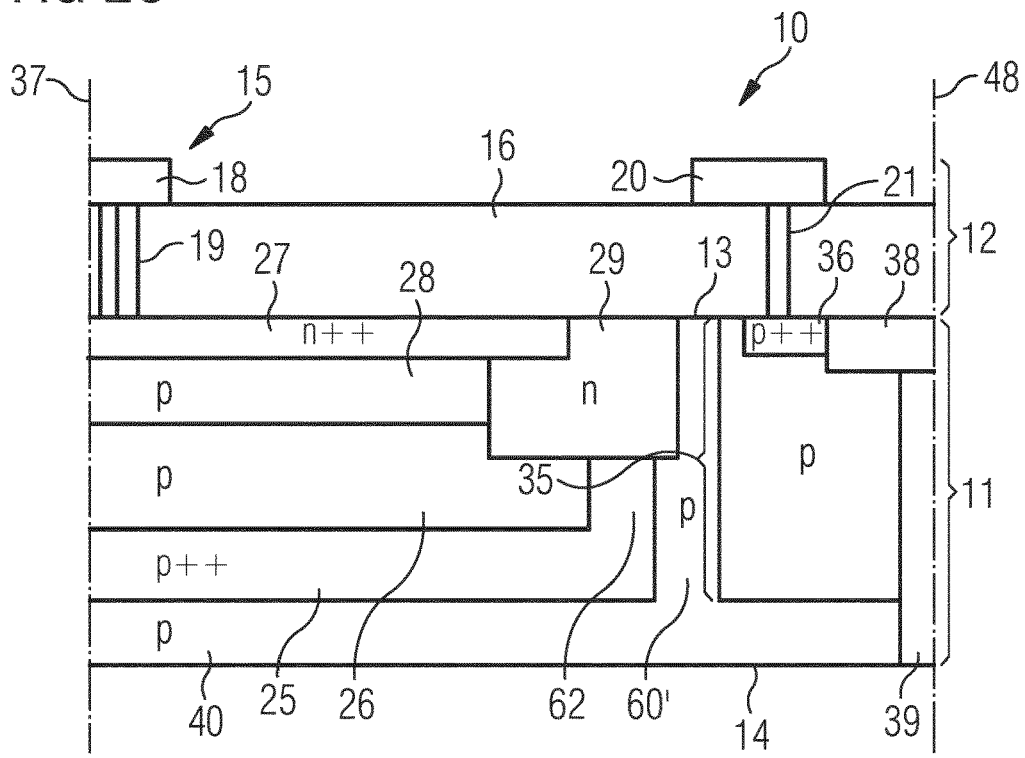

FIG. 2C shows a further example of the avalanche diode 10 which is based on the above-shown examples. The separating region 60' encircles the buried layer 25. The separating region 60' surrounds or encompasses the buried layer 25. The separating region 60' is located between the buried layer 25 and the sinker 35. Thus, the separating region 60' separates the buried layer 25 from the sinker 35. The doping of the separating region 60' is fabricated using the WPE effect. A doping concentration in the separating region 60' may be slightly higher than the doping concentration of the substrate 40. The doping concentration of the separating region 60' may be slightly higher than a minimum doping concentration of the first region 26. Thus, there is a slightly conducting bridge between the buried layer 25 and the sinker 35. The doping concentration of the separating region 60' is lower than a maximum doping concentration of the buried layer 25 and also lower than a maximum doping concentration of the sinker 35. The maximum doping concentration of the sinker 35 may be obtained in the sinker contact region 36.

The semiconductor body 11 comprises a shield ring 62 that is arranged between the guard ring 29 and the buried layer 25. The shield ring 62 is of the first type of conductivity. The shield ring 62 encircles the first region 26. The doping of the shield ring 62 is fabricated using the WPE effect. A doping concentration of the shield ring 62 is lower than a maximum doping concentration of the buried layer 25. The doping concentration of the shield ring 62 may be also lower than a maximum doping concentration of the enhancement region 28. The doping concentration of the shield ring 62 is higher than the doping concentration of the substrate 40. The doping concentration of the shield ring 62 may be similar to the doping concentration of the separating region 60, as shown in FIG. 3D.

According to FIG. 2C, the sinker 35 extends to the deep trench 39, such as also shown in FIGS. 1A and 1B.

In an alternative embodiment, the guard ring 29 is omitted. In this case, the shield ring 62 is arranged between the first surface 13 of the semiconductor body 11 and the buried layer 25 or between the shallow region 27 and the buried layer 25.

Figure 2D:
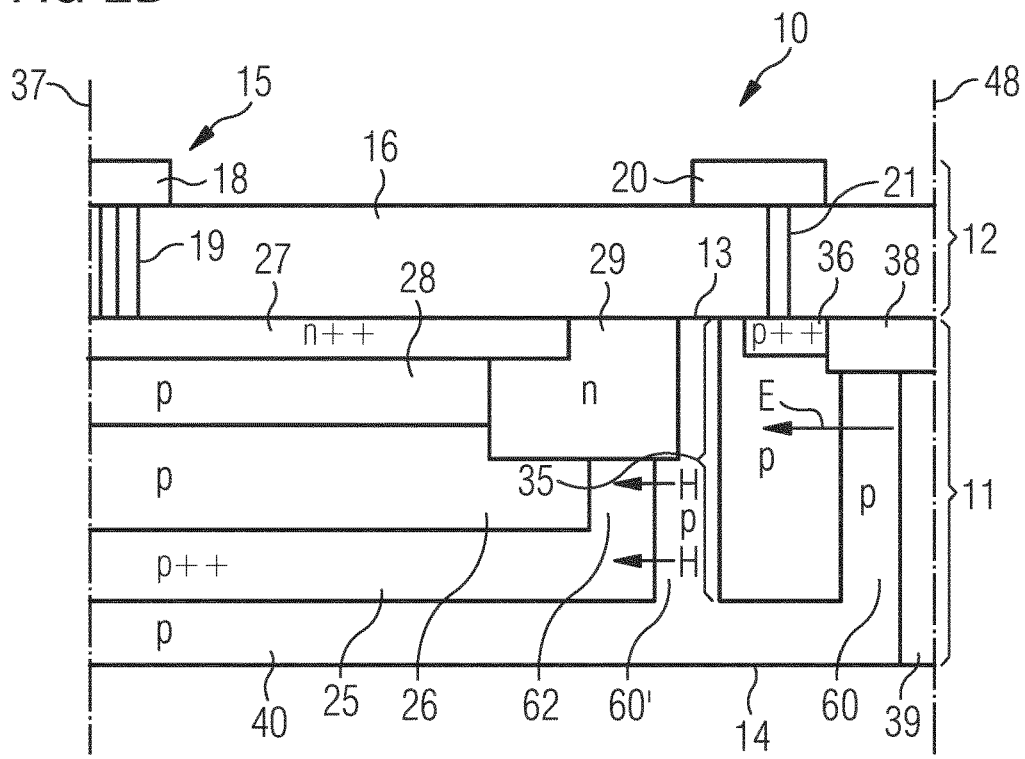

FIG. 2D shows a further example of the avalanche photodiode 10 which is based on the above-shown examples, especially of the examples shown in FIGS. 2B and 2C. A first part 60' of the separating region separates the buried layer 25 from the sinker 35. A second part 60 of the separating region separates the sinker 35 from the deep trench 39. Thus, the embodiments shown in FIGS. 2A and 2C are combined in the example shown in FIG. 2D.

As discussed above, a doping gradient increases along the arrow E. Therefore, a positive electric field is introduced which hinders electrons generated at the interface of the deep trench 39 to silicon to reach the avalanche multiplication region 50.

Additionally, a doping gradient increases along arrows H. Therefore, a positive electric field is introduced which hinders electrons to reach the avalanche multiplication region 50. Thus, electrons generated outside of this barrier do not contribute to the jitter tail. The barrier is realized by the transition of the separating region 60' to the buried layer 25 and optionally also by the transition of the shield ring 62 to a region between the shield ring 62 and the sinker 35.

The avalanche photodiode 10 realizes a p-well to deep trench spacing and a p-barrier by WPE. Advantageously, a reduced DCR originates from the deep trench 39. The jitter is reduced because carrier diffusion towards the avalanche multiplication region 50 is suppressed by electric fields (indicated by the arrows E and H).

Figure 3A:
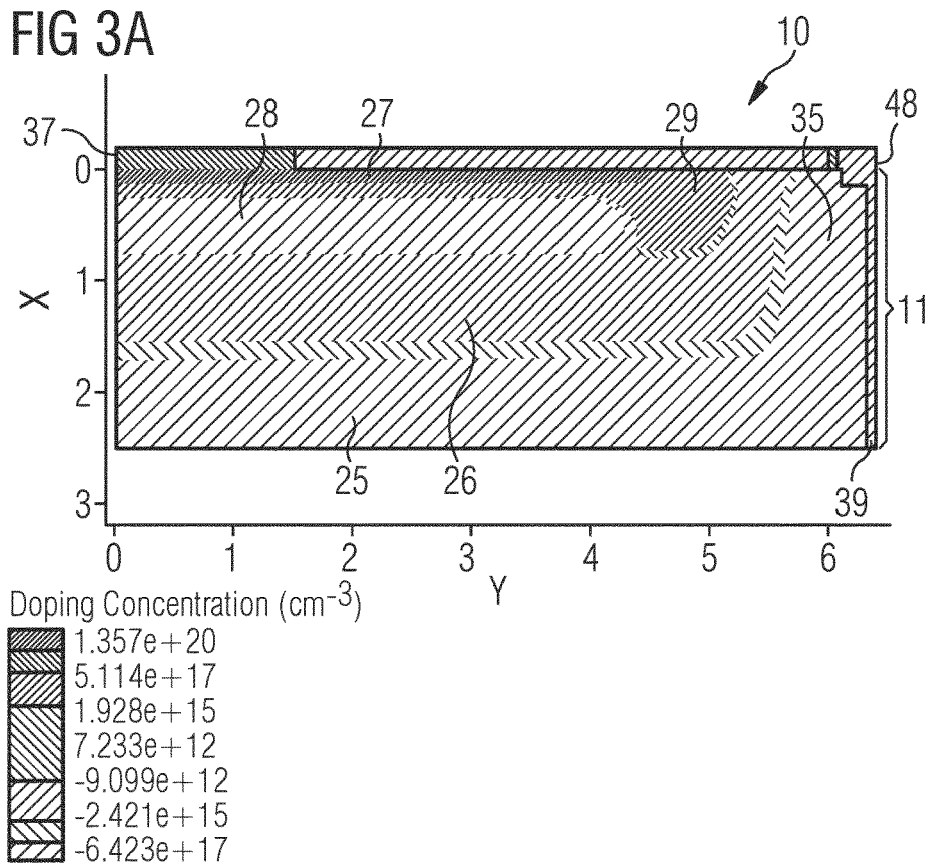
FIGS. 3A to 3D show examples of doping concentrations of the avalanche photodiodes of FIGS. 1A, 1B and 2A to 2D.
Figure 3B:
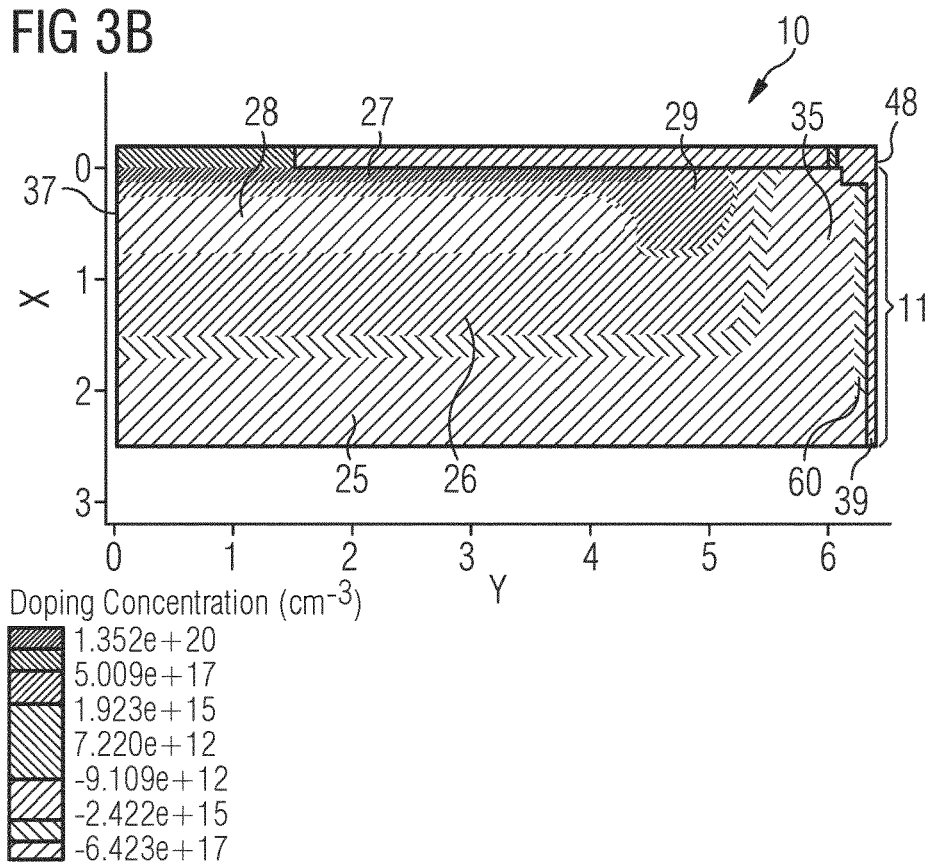
Figure 3C:
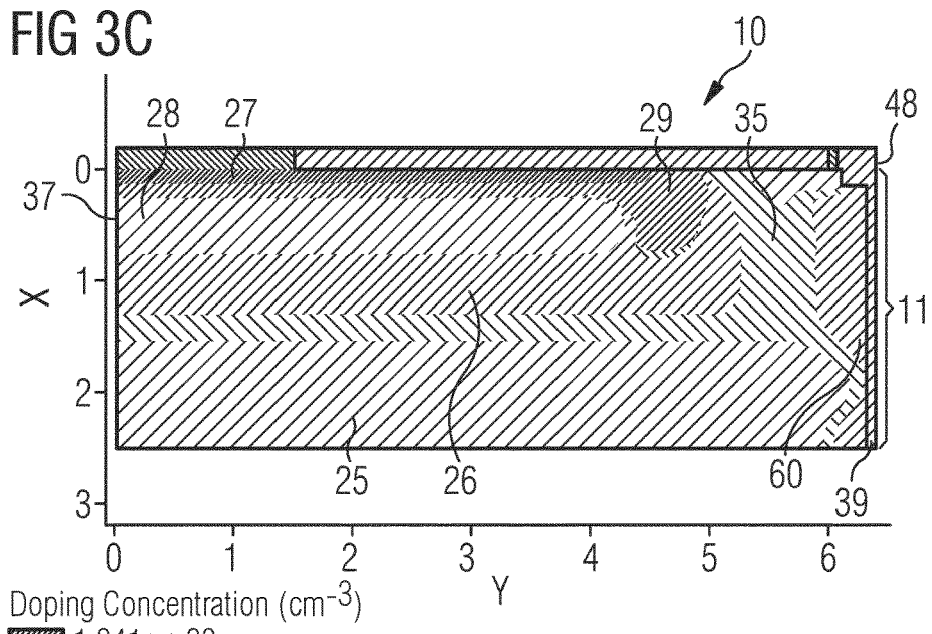
Figure 3D:
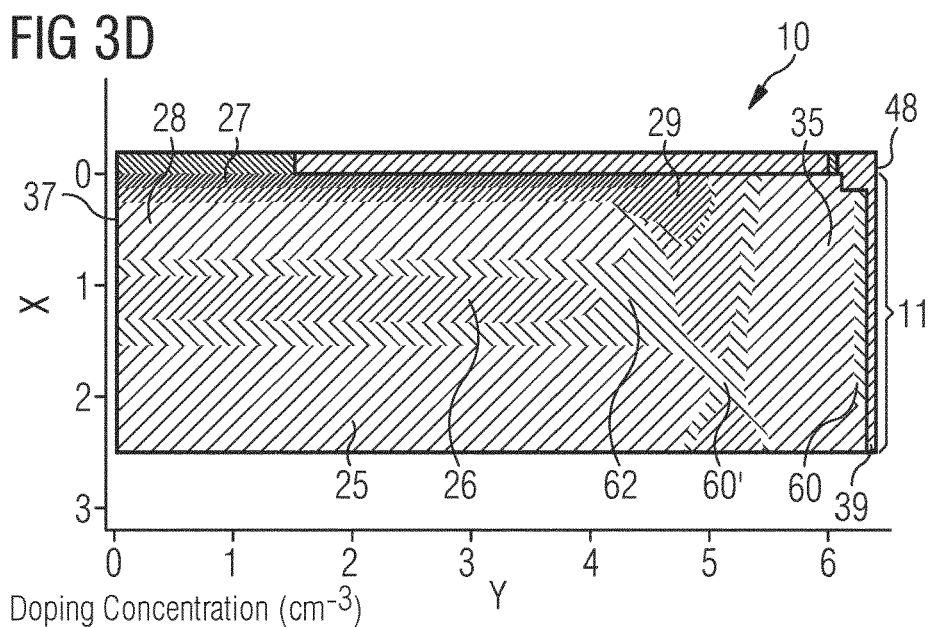
Figure 4A:
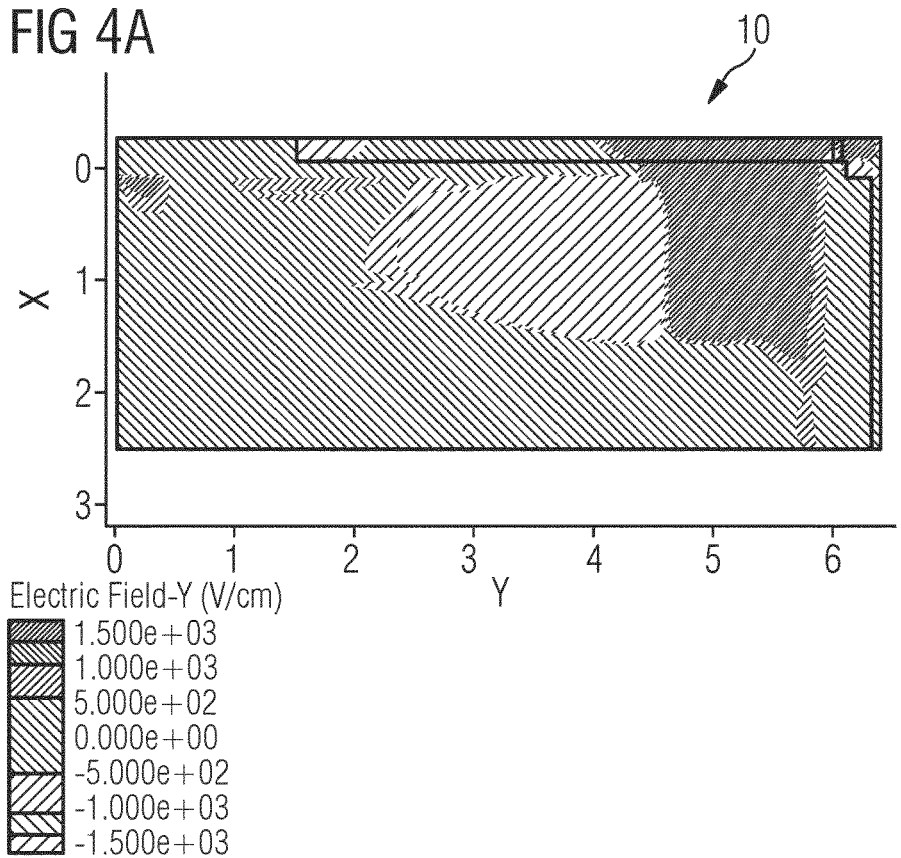
FIGS. 4A to 4D show examples of electrical fields of the avalanche photodiodes of FIGS. 1A, 1B and 2A to 2D.
Figure 4B:
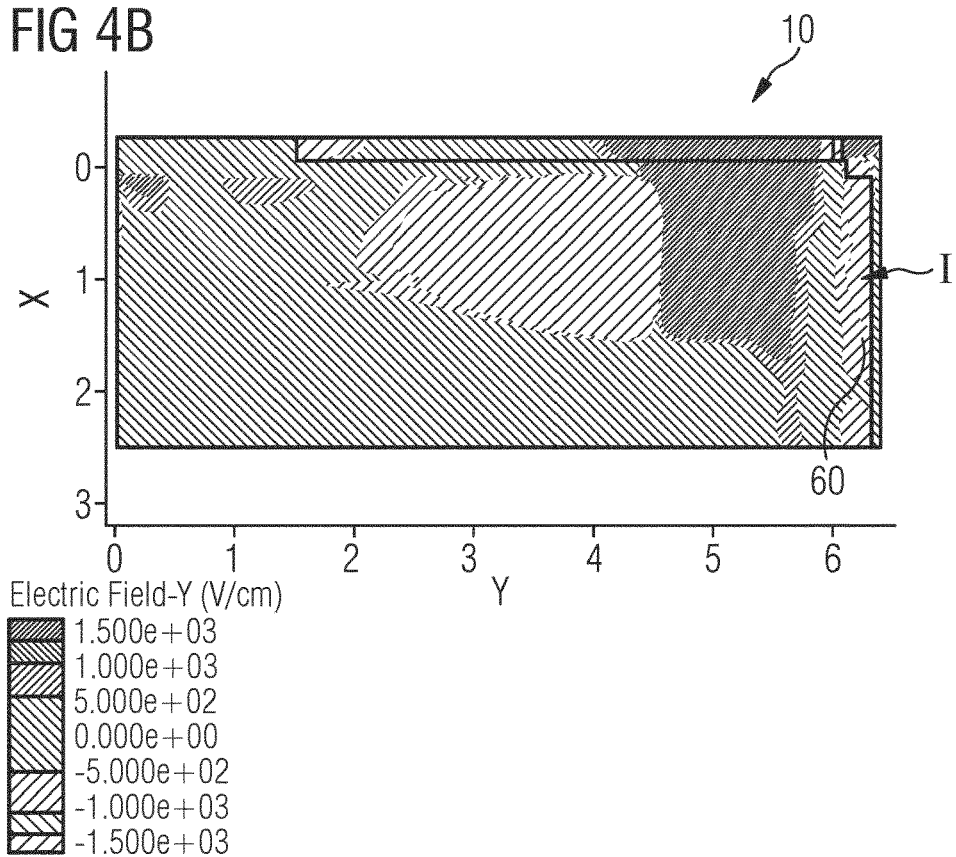
Figure 4C:
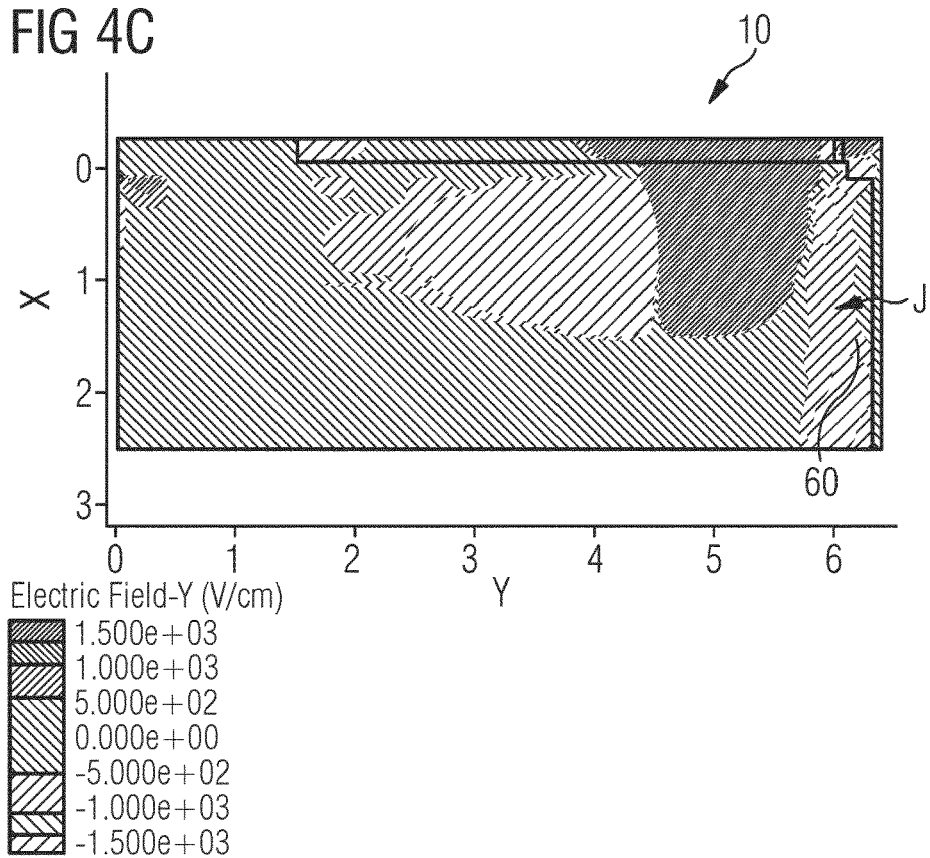

FIGS. 3A to 3D show examples of doping concentrations of the above-described examples of the avalanche photodiode 10. Moreover, FIGS. 4A to 4D show examples of electric fields during operation for the different examples of the avalanche photodiode 10. FIGS. 3A and 4A correspond to the example of the avalanche photodiode 10 shown in FIGS. 1A and 1B; FIGS. 3B and 4B correspond to the example shown in FIG. 2A; FIGS. 3C and 4C correspond to the example shown in FIG. 2B; and FIGS. 3D and 4D correspond to the example shown in FIG. 2D. The simulations shown in FIGS. 3A to 3D and 4A to 4D are performed by using a simulation tool.

Figure 4D:
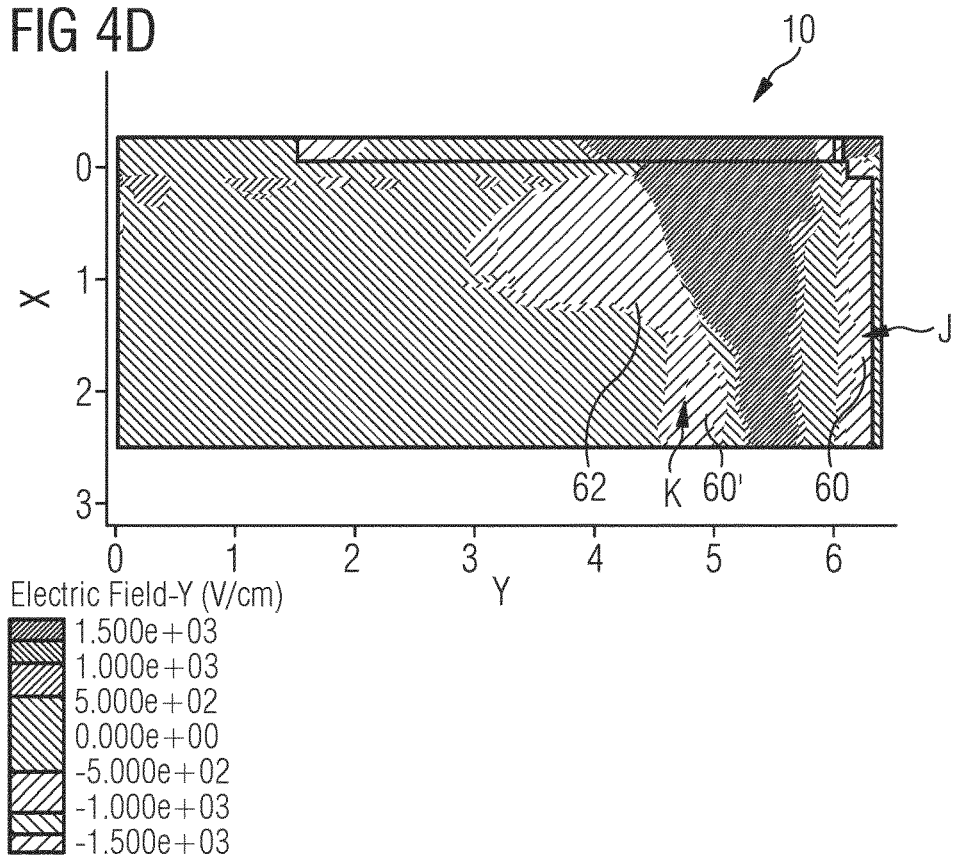

In FIG. 4B, arrow I indicates an area with a negative electric field along most of the deep trench 39. In FIGS. 4C and 4D, arrow J indicates an area with a negative electric field all along the deep trench 39. Moreover, in FIG. 4D, arrow K indicates an area with a negative electric field. No carriers generated right from here can reach the avalanche multiplication region 50.

Figure 5A:
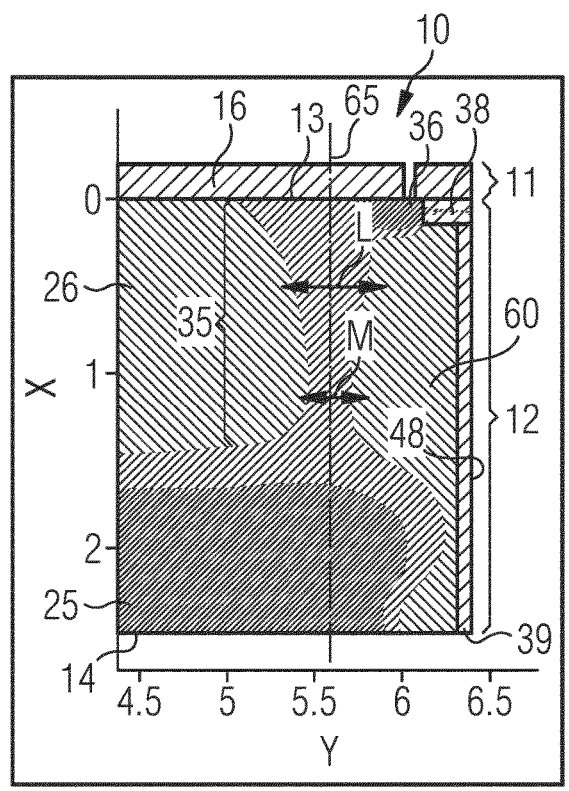
FIGS. 5A and 5B show an example of a doping concentration of a cross-section of an avalanche photodiode.
Figure 5B:
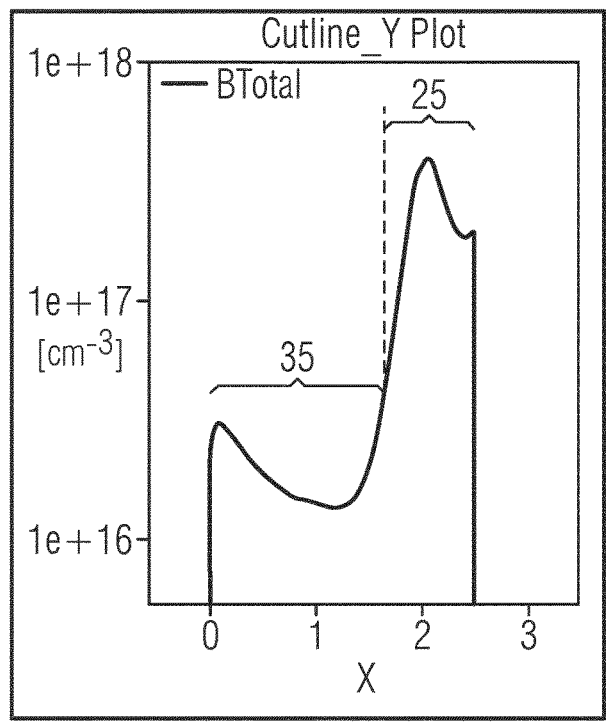

FIGS. 5A and 5B show details of characteristics of the avalanche photodiode 10 fabricated using WPE, as shown in FIGS. 2B and 3C. In FIG. 5A, details of the doping concentration of the sinker 35 are shown. The sinker 35 realized using WPE (for example as shown in FIGS. 2B, 3C and 5A) differs from the sinker 35 as shown in FIGS. 1A, 1B, 2A, 3A and 3B. A doping concentration of the sinker 35 as shown in FIGS. 1A, 1B, 2A typically has a high value from the first surface 13 of the semiconductor body 11 up to the buried layer 25. For example, the doping concentration inside the sinker 35 may be approximately constant from the first surface 13 to the buried layer 35. Contrary to that, as shown in FIGS. 5A and 3C, the minimum of the doping concentration of the sinker 35 is lower than the maximum of the doping concentration of the buried layer 25 and also of sinker contact region 36.

Moreover, some regions of the sinker 35 are not directly below the sinker contact region 38.

The doping concentration of the sinker 35, created by the WPE, has certain properties related to the WPE: The doping concentration of the sinker 35 is always lower than the highest doping concentration of the buried layer 25. For example, the highest doping concentration of the buried layer 25 is five times larger than the doping concentration of the sinker 35 (typically the ratio is 10 times to 20 times). The width of the sinker 35 is larger closer to the first surface 13 (this is indicated by the two arrows L and M). The sinker 35 may have a wasp waist shape. The sinker 35 has a decreasing lateral dimension with increasing distance from the first surface 13.

FIG. 5B shows an example of the doping concentration on a line 65 shown in FIG. 5A. The doping concentration has a first peak approximately near the first surface 13 of the semiconductor body 11 and decreases with increasing distance from the first surface 13. The doping concentration rises again to a second peak which is achieved by the doping concentration of the buried layer 25. Thus, the second peak shown in FIG. 5B is a result of the buried layer 25 and not part of the sinker 35. In one example, the doping concentration is only the boron doping concentration. Thus, one can discriminate between a fabrication process with WPE and without WPE by a measurement of doping concentrations in a cross section of the sinker 35 and the buried layer 25.

The following FIGS. 6A to 11D show examples of layouts of masks for the fabrication of the avalanche diode 10. The example layouts mostly show octagonal structures.

Alternatively, the layouts may also be quadratic, circular or rectangular. In most cases, the layers and regions of the avalanche diode 10 in a top view are identical or approximately identical with the layout of the masks for fabricating these layers and regions. Differences may result e.g. from a diffusion process, overexposure or underexposure of photoresist etc. In case of the buried layer 25 and the sinker 35, differences may result from the WPE, the large distance from the photoresist to the buried layer 25, a diffusion process and a high ion implantation dose and energy.

FIGS. 6A, 7A, 8A, 9A, 10A and 11A show a top view of layouts of masks corresponding to the avalanche photodiode 10 shown in FIGS. 1A and 1B. FIGS. 6B, 7B, 8B, 9B, 10B and 11B show a top view corresponding to the example shown in FIG. 2A. FIGS. 6C, 7C, 8C, 9C, 10C and 11C show top views corresponding to the example shown in FIG. 2B. Similarly, FIGS. 6D, 7D, 8D, 9D, 10D and 11D show top views corresponding to the example shown in FIG. 2D. Thus, the four avalanche photodiode 10 and the four further avalanche photodiode 10' shown in FIGS. 6A to 6D are typically not realized on one wafer or one die; instead the avalanche photodiode 10 and the further avalanche photodiode 10' shown in FIG. 6A may be realized on one die, the avalanche photodiode 10 and the further avalanche photodiode 10' shown in FIG. 6B may be realized on another die etc. The same applies to the other FIGS. 7A to 11D.

FIGS. 6A to 6D show the layout for the masks to realize the shallow region 27, the deep trench 39 and the sinker 35. The shallow region 27 has an orthogonal form in the top view in the four examples shown in FIGS. 6A to 6D. As mentioned above, the shallow region 27 may also be circular, rectangular or quadratic. The deep trench 39 has the form of four stripes on the border of a rectangle or quadrat. The deep trench 39 is located at the border from one pixel to another pixel. Thus, two adjacent pixels or avalanche photodiodes 10, 10' have a common deep trench 39. As shown in FIGS. 6A, 6B and 6D, an inner border or boundary of the sinker 35 has an orthogonal shape in the top view. As shown in FIG. 6C, there is no mask for realization of the sinker 35, since the sinker 35 is realized using the WPE effect during fabrication of the buried layer 25.

FIGS. 7A to 7D show the layout of the masks that are already elucidated in FIGS. 6A to 6D and additionally the layout for the enhancement region 28 and the guard ring 29. The area of the enhancement region 28 is smaller in comparison to the area of the shallow region 27.

Figure 8D:
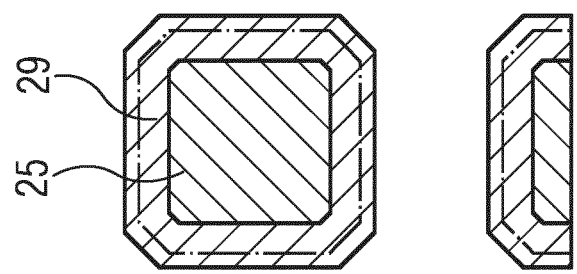
Figure 8C:
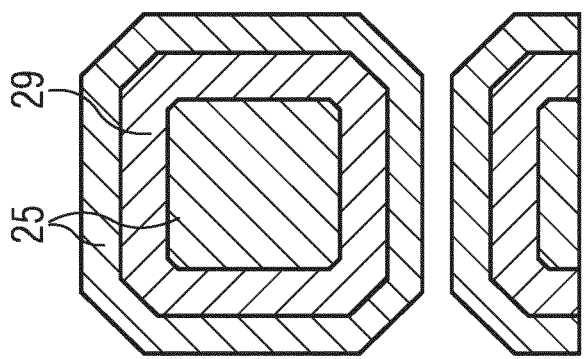
Figure 8B:
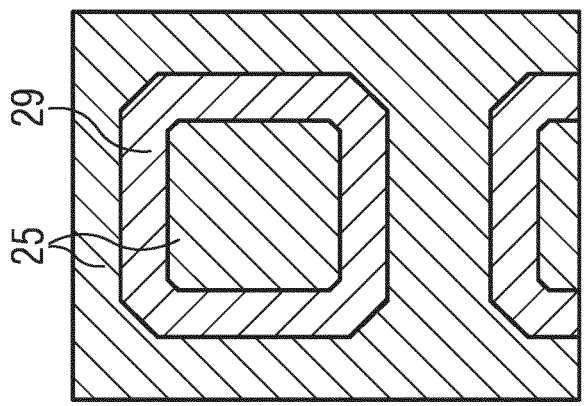
Figure 8A:
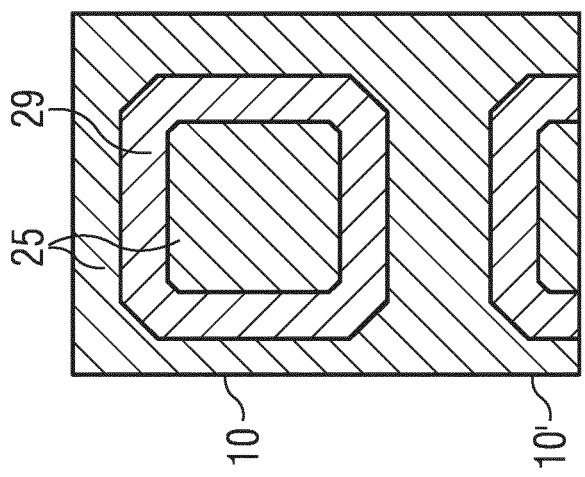
Figure 9D:
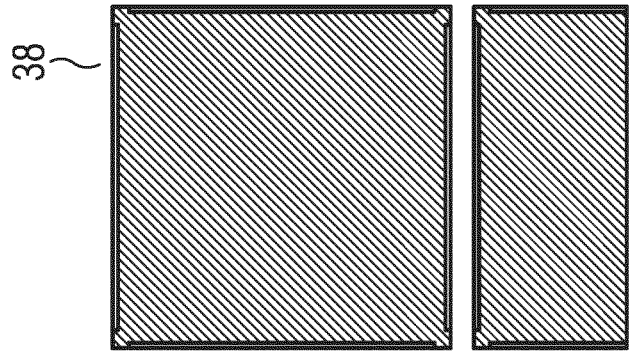
Figure 9C:
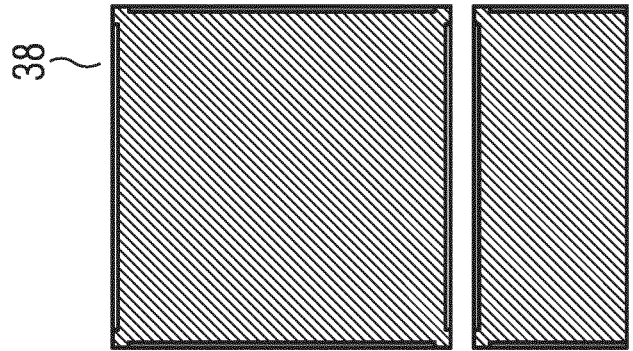
Figure 9B:
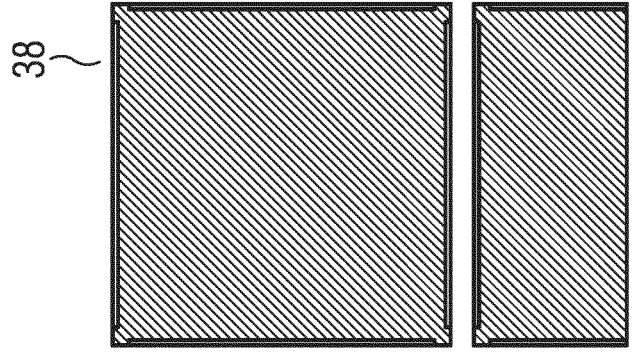
Figure 9A:
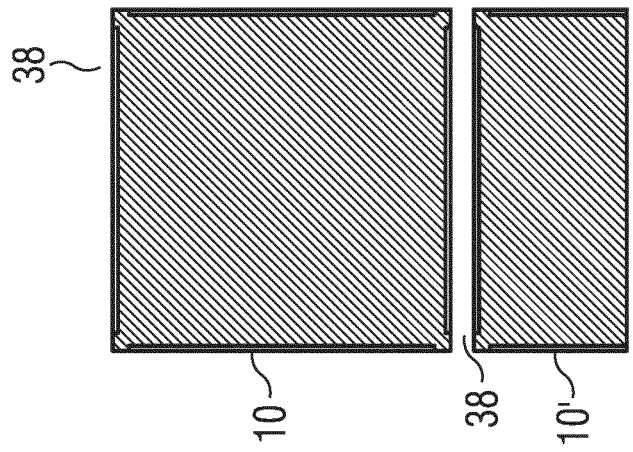
Figure 11D:
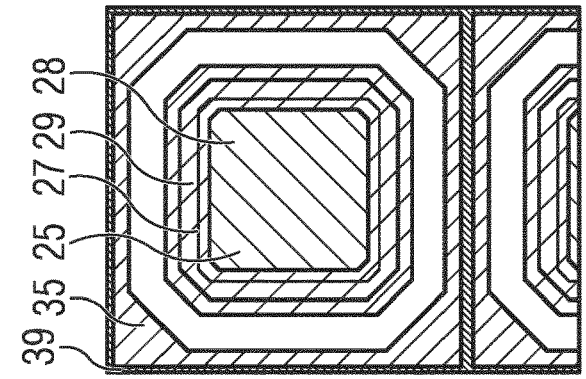
Figure 11C:
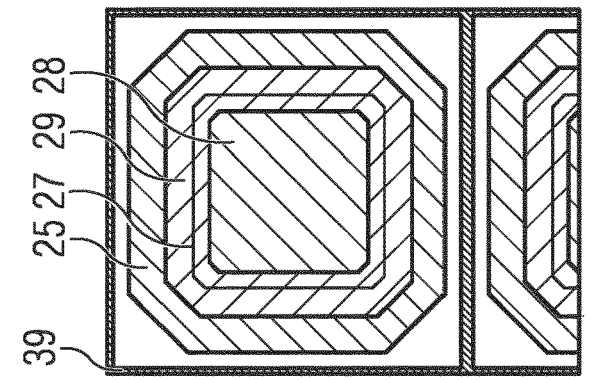
Figure 11B:
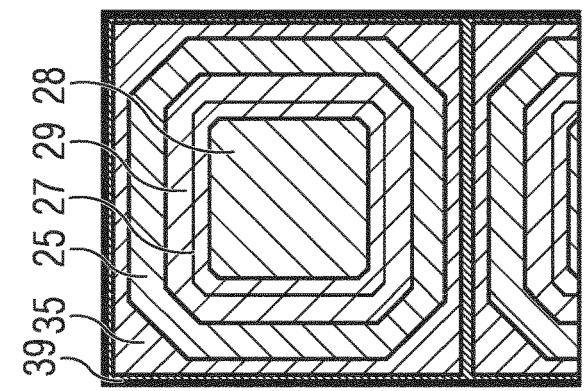
Figure 11A:
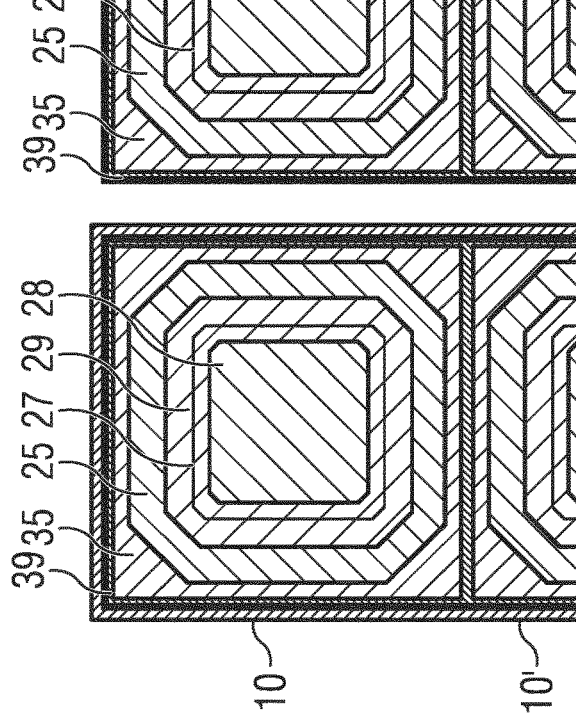

FIGS. 8A to 8D show the layout for the masks for the buried layer 25 and the guard ring 29 (the guard ring 29 is also shown in FIGS. 7A to 7D). As shown in FIGS. 8A and 8B, the buried layer 25 may be, for example, fabricated over the complete wafer and, thus, without using any mask. Thus, the buried layer 25 extends into the complete area of the avalanche photodiode 10 and also into the complete area of the array of avalanche photodiodes. Only in case that the semiconductor body 11 comprises not only the array of the avalanche diodes 10 but also further parts such as an integrated circuit, a mask is required for the realization of the buried layer 25 to keep the area of the integrated circuit free from the buried layer 25.

The layout of the mask for the buried layer 25 shown in FIG. 8C is designed such that the separating region 60 between the sinker 35 and the buried layer 25 on one side and the deep trench 35 on the other side can be realized. As shown in FIG. 8D, the mask for the buried layer 25 is realized such that a large gap between the buried layer 25 and the deep trench 39 is realized. The use of masks as shown in FIGS. 8C and 8D result into the WPE.

FIGS. 9A to 9D show an example of a layout of an inverse mask of the isolation region 38. Thus, the isolation region 38 is fabricated at areas on the first surface 13 of the semiconductor body 11 which are not covered by the mask shown in FIGS. 9A to 9D. The isolation region 38 has the form of stripes at the borders of the avalanche photodiodes 10, 10'. Thus, the avalanche photodiode 10 and the adjacent avalanche photodiode 10' have a common isolation region 38.

FIGS. 10A to 10D show an example of layouts of the mask for the realization of the sinker contact region 36 and also the inverse mask for the realization of the isolation region 38. The inner border of the sinker contact region 36 has an orthogonal form. The sinker contact region 36 has the form of four triangles at the four corners of the avalanche photodiode 10, wherein the triangles are connected by small stripes. The sinker contact region 36 is realized also in case the sinker 35 is realized by WPE (as shown in FIG. 10C).

FIGS. 11A to 11D show the examples of the layouts of different masks shown above with the exception of the masks of the isolation region 38 and the sinker contact region 36.

Instead of the word "region" sometimes the words "layer" or "well" could be used.

The embodiments shown in FIGS. 1A to 11D as stated represent example embodiments of the improved semiconductor body, avalanche photodiode and method for fabricating a semiconductor body, therefore they do not constitute a complete list of all embodiments according to the improved semiconductor body, avalanche photodiode and method for fabricating. Actual semiconductor bodies, avalanche photodiodes and methods for fabricating may vary from the embodiments shown in terms of layers, shape, size and materials, for example.

The invention claimed is:

1. A semiconductor body, comprising
a buried layer of a first type of conductivity,
a first region of the first type of conductivity,
a shallow region of a second type of conductivity at a first surface of the semiconductor body, wherein the first region is between the buried layer and the shallow region,
a sinker of the first type of conductivity located at the first surface of the semiconductor body,
a separating region of the first type of conductivity encircling at least one of the sinker and the buried layer, wherein the separating region encircles the buried layer,
a guard ring of the second type of conductivity located at the first surface of the semiconductor body and encircling the shallow region, and
a shield ring of the first type of conductivity, wherein the shield ring is arranged between the guard ring and the buried layer.

2. The semiconductor body of claim 1,
wherein a doping concentration of the separating region is lower than a doping concentration of the sinker and/or the buried layer.

3. The semiconductor body of claim 1, wherein the separating region of the first type of conductivity encircles the buried layer and wherein the doping concentration of the separating region is lower than the doping concentration of the sinker and/or the buried layer.

4. The semiconductor body of claim 1,
comprising an enhancement region of the first type of conductivity located between the first region and the shallow region.

5. The semiconductor body of claim 1,
comprising an isolation region,
wherein the isolation region is located at the first surface of the semiconductor body and encircles the sinker at the first surface of the semiconductor body.

6. The semiconductor body of claim 1,
wherein the sinker encircles the first region and extends from the first surface of the semiconductor body to the buried layer.

7. The semiconductor body of claim 1,
wherein the sinker has a first doping concentration at the first surface of the semiconductor body,
wherein the sinker has a second doping concentration in a region between the first surface of the semiconductor body and the buried layer, and
wherein the second doping concentration is lower than the first doping concentration and lower than a maximum doping concentration of the buried layer.

8. The semiconductor body of claim 1,
wherein the doping concentration of the sinker is always lower than the highest doping concentration of the buried layer and the sinker has a decreasing lateral dimension with increasing distance from the first surface.

9. The semiconductor body of claim 1,
wherein the separating region encircles the sinker.

10. The semiconductor body of claim 9,
comprising a deep trench, wherein the separating region is located between the sinker and the deep trench and the deep trench encircles the separating region.

11. The semiconductor body of claim 10, wherein the deep trench
extends from the first surface of the semiconductor body or from the isolation region at least to the buried layer and wherein the sinker extends from the first surface of the semiconductor body to the buried layer.

12. The semiconductor body of claim 1,
wherein the separating region is located between the sinker and the buried layer.

13. An avalanche photodiode, comprising
the semiconductor body of claim 1, and
a stack of at least one isolating layer and at least one metallization layer, wherein the stack is located at the first surface of the semiconductor body.

14. A method for fabricating a semiconductor body, comprising
fabricating a buried layer of a first type of conductivity,
fabricating a shallow region of a second type of conductivity at a first surface of the semiconductor body, wherein a first region has a first type of conductivity and is between the buried layer and the shallow region,
fabricating a sinker of the first type of conductivity located at the first surface of the semiconductor body, wherein a separating region of the first type of conductivity encircles the buried layer,
fabricating a guard ring of the second type of conductivity located at the first surface of the semiconductor body and encircling the shallow region, and
fabricating a shield ring of the first type of conductivity, wherein the shield ring is arranged between the guard ring and the buried layer.

15. The method of claim 14,
wherein the lower part of the sinker and the buried layer are fabricated at the same time.

* * * * *